United States Patent
Ueda et al.

(10) Patent No.: US 6,723,455 B2
(45) Date of Patent: Apr. 20, 2004

(54) ORGANIC ELECTRO-LUMINESCENT ELEMENT AND MATERIAL OF ORGANIC ELECTRO-LUMINESCENT ELEMENT

(75) Inventors: Noriko Ueda, Hino (JP); Mitsunori Matsuura, Hino (JP); Hiroshi Kita, Hino (JP)

(73) Assignee: Konica Corporation (JP)

( * ) Notice: Subject to any disclaimer, the term of this patent is extended or adjusted under 35 U.S.C. 154(b) by 0 days.

(21) Appl. No.: 09/962,483

(22) Filed: Sep. 24, 2001

(65) Prior Publication Data

US 2002/0094452 A1 Jul. 18, 2002

(30) Foreign Application Priority Data

Sep. 25, 2000 (JP) ........................ 2000-290466
Dec. 19, 2000 (JP) ........................ 2000-385286

(51) Int. Cl.[7] ................ B32B 19/00; B32B 9/00; C09K 11/06; H01J 1/62; H01J 63/04; C07C 211/00

(52) U.S. Cl. .............. 428/690; 428/917; 252/301.16; 313/504; 313/506; 564/305; 564/428; 564/433; 564/434

(58) Field of Search ............... 428/690, 917; 313/504, 506; 252/301.16; 564/433, 305, 434, 428

(56) References Cited

U.S. PATENT DOCUMENTS 5,728,801 A * 3/1998 Wu et al. ................ 528/422

(List continued on next page.)

FOREIGN PATENT DOCUMENTS

EP 0765106 3/1997

(List continued on next page.)

OTHER PUBLICATIONS

European Search Report EP 01 12 2501.

(List continued on next page.)

Primary Examiner—Cynthia H. Kelly
Assistant Examiner—C Thompson
(74) Attorney, Agent, or Firm—Muserlian, Lucas and Mercanti

(57) ABSTRACT

An electro-luminescent element comprising an organic compound layer is disclosed. The organic compound layer contains a compound represented by Formula I or Formula V:

Formula I

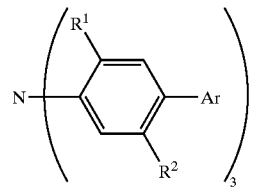

wherein $R^1$ and $R^2$ are each a substituent, and Ar is an aromatic hydrocarbon ring or an aromatic heterocyclic ring each of them may have a substituent, Formula V

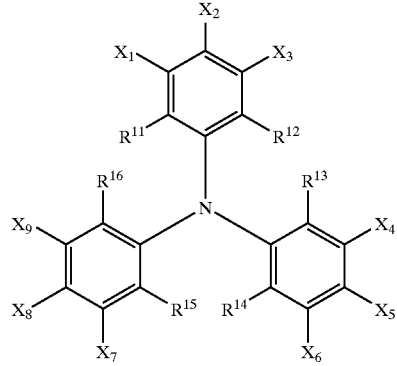

wherein $R^{11}$ through $R^{16}$ and $X_1$ through $X_9$ are each a hydrogen atom or a substituent, they may be the same or different; and the sum of the steric parameters $Es_{R1}$ through $Es_{R16}$ of $R^{11}$ through $R^{16}$ satisfies the following expression:

$$Es_{R11}+Es_{R12}+Es_{R13}+Es_{R14}+Es_{R15}+Es_{R16} \leq -2.0.$$

2 Claims, 5 Drawing Sheets

U.S. PATENT DOCUMENTS

| | | | | |
|---|---|---|---|---|
| 5,792,557 A | * | 8/1998 | Nakaya et al. | 428/411.1 |
| 5,814,244 A | * | 9/1998 | Kreuder et al. | 252/301.6 |
| 6,022,998 A | | 2/2000 | Kawaguchi et al. | 564/434 |
| 6,242,648 B1 | * | 6/2001 | Yamasaki et al. | 564/405 |
| 6,376,106 B1 | * | 4/2002 | Uchida et al. | 428/690 |
| 6,387,545 B1 | * | 5/2002 | Liu et al. | 428/690 |

FOREIGN PATENT DOCUMENTS

| | | |
|---|---|---|
| EP | 0797375 | 9/1997 |
| EP | 0866110 | 9/1998 |
| EP | 0825804 | 2/1999 |
| EP | 0929104 | 7/1999 |
| EP | 0964459 | 12/1999 |
| EP | 1013740 | 6/2000 |
| JP | 03152897 | 6/1991 |
| JP | 06184531 | 7/1994 |
| JP | 08286033 | 11/1996 |
| JP | 10092578 | 4/1998 |
| JP | 10106749 | 4/1998 |

OTHER PUBLICATIONS

Patent Abstracts of Japan, Publication #054280, publication date Feb. 26, 1999 (1 pg. of English Abstract).

* cited by examiner

ORGANIC ELECTRO-LUMINESCENT ELEMENT AND MATERIAL OF ORGANIC ELECTRO-LUMINESCENT ELEMENT

FIELD OF THE INVENTION

This invention relates to an organic electro-luminescent, hereinafter referred to EL, element, a material of electro-luminescent element, and an electro-luminescent display apparatus.

BACKGROUND OF THE INVENTION

Although an inorganic electro-luminescent element have been usually used as a flat panel light source, a high voltage alternating current is necessary to drive such the light emission element.

A recently developed organic electro-luminescent element is constituted by a thin layer containing a fluorescent organic compound provided between a cathode and an anode. The organic electro-luminescent element is an element emitting light, fluorescent or phosphorescent light, generated by deactivation of an exciton which is formed by an electron and a positive hole injected into the thin layer. Such the element is a self-light emission type element which can emit light by a low voltage power source such as several volt to several dozens volt. Accordingly the element is noticed from the viewpoint of space saving and portability since such the element is a thin layer type complete solid element having a wide visible angle and a high visuality.

Although various organic EL elements have been reported, no example has been reported which satisfies the required properties such as the brightness of emitted light and the life regarding the element emitting light within the range of from blue to bluish purple. For example, Japanese Patent Publication Open to Public Inspection hereinafter referred to JP O.P.I., No. 3-152897 reports an organic electro-luminescent element containing p-quaternary phenyl emits light of 420 nm. However, such the element is insufficient in the brightness of emitted light.

Compounds including benzimidazole in the molecular thereof are disclosed in JP O.P.I. Nos. 10-92578 and 10-106749, but the brightness of emitted light is insufficient.

A fluorescent material composed of a pyrazoline compound is disclosed in JP O.P.I. No. 6-184531. However, such the compound is insufficient from the viewpoint of thermal stability for using as the material of the organic EL element.

It is known in JP O.P.I. No. 8-286033 that N,N'-diphenyl-N,N' (3-methylphenyl) [1,1'biphenyl]-4,4'-diamine (TPD) emits light at 420 nm. However, this compound has a shortcoming that the color purity is low when red light is made by the use of a color conversion filter.

As the light emission material for the organic electro-luminescent element emitting light of from blue to bluish purple, a material capable of emitting higher light brightness is demanded from such the viewpoints and further raising in the energy conversion efficiency and the quantum efficiency of light emission are expected.

In an organic EL element emitting light in the region other than blue to bluish purple, a positive hole charge transportation material excellent in the thermal stability is required by which the light emitting layer can emit light with a high brightness.

When an organic EL element or a display device using an organic EL element is used as a portable tool, one using a glass substrate is possibly broken by an accidental shock such as falling since such the device has no flexibility.

The degradation of the light emission property of the organic EL element is caused by formation of a dark spot which is formed by inversion of moisture of the atmosphere.

SUMMARY OF THE INVENTION

The first object of the invention is to provide an organic EL element capable of emitting light within the range of from blue to bluish purple and excellent in the light brightness and the life. The second object of the invention is to provide an organic EL element excellent in the brightness of the emitted light and the life. The third object of the invention is to provide an organic EL element capable of emitting light within the range of from blue to bluish purple and excellent in the brightness of the emitted light and the life. The fourth object of the invention is to provide a positive hole charge transportation material for constituting an organic EL element excellent in a long life. The fifth object of the invention is to provide a display apparatus using the organic EL element. The sixth object of the invention is to provide an organic EL element having flexibility. The seventh object of the invention is to provide an organic EL element maintaining stable luminescence property in the atmosphere.

The invention is attained by the find by the inventors that an organic element emitting light within the range of from blue to bluish purple and having excellent brightness of emitted light and life can be obtained by the use of a specific compound.

Moreover, it is found that a compound is suitable, in which the central nitrogen-carbon bond of a triarylamine is twisted by introducing a substituent to the position-2 of the aryl group. In such the case, the light emitting efficiency is raised when a cathode buffer layer is provided between the light emission layer and the cathode.

Furthermore, the light emitting efficiency and the life are further raised when the compound according to the invention is used as a positive hole charge transportation material compared with a usual positive hole charge transportation material.

The invention and its preferable embodiments are described.

1. An electro-luminescent element comprising an organic compound layer, wherein the organic compound layer contains a compound represented by Formula I or Formula V:

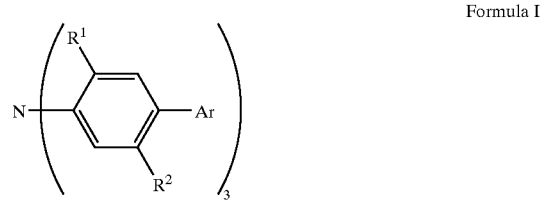

Formula I wherein $R^1$ and $R^2$ are each a substituent, and Ar is an aromatic hydrocarbon ring or an aromatic heterocyclic ring each of them may have a substituent, Formula V

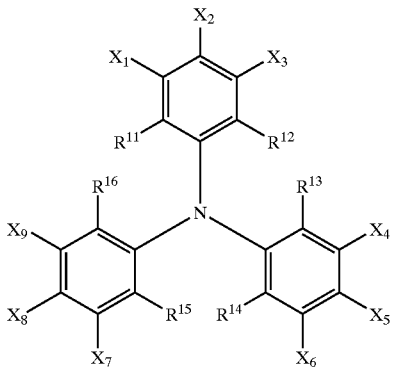

wherein $R^{11}$ through $R^{16}$ and $X_1$ through $X_9$ are each a hydrogen atom or a substituent, they may be the same or different; and the sum of the steric parameters $Es_{R1}$ through $Es_{R16}$ of $R^{11}$ through $R^{16}$ respectively satisfies the following expression:

$$Es_{R11}+Es_{R12}+Es_{R13}+Es_{R14}+Es_{R15}+Es_{R16} \leq -2.0.$$

2. The organic electro-luminescent element of item 1, wherein the organic compound layers contains a compound represented by Formula I.
3. The organic electro-luminescent element of item 1, wherein the organic compound layers contains a compound represented by Formula V.
4. The organic electro-luminescent element of item 2, wherein the Ar in Formula I is a group represented by Formula II:

Formula II

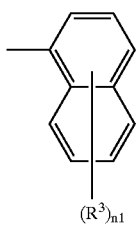

wherein one or more $R^3$s are each a substituent and n1 is an integer of from 0 to 7.
5. The organic electro-luminescent element of item 4, wherein Ar in Formula I is a group represented by Formula III:

Formula III

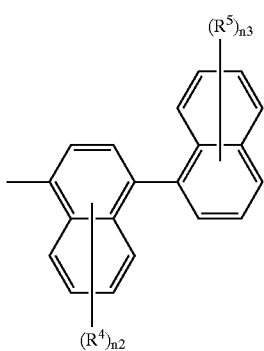

wherein one or more $R^4$ and $R^5$ are each a substituent, n2 is an integer of from 0 to 6, and n3 is an integer of from 0 to 7.

6. The electro-luminescent element of item 2 wherein the organic compound is a compound represented by Formula IV:

Formula IV

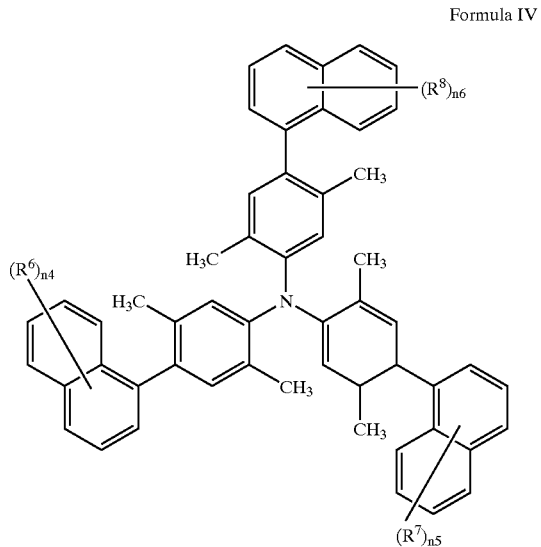

wherein at least one of $R^6$, $R^7$ and $R^8$ is an alkyl group, a cycloalkyl group, an aryl group, a halogen atom, an alkoxy group, an aryloxy group or a heterocyclic group; and n4, n5 and n6 are each an integer of from 0 to 7.
7. The organic electro-luminescent element of item 3, wherein the organic compound is represented by Formula VI

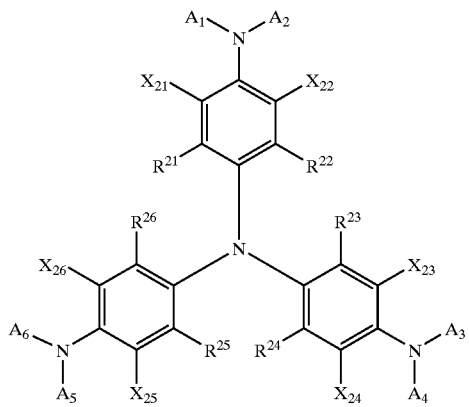

wherein $R^{21}$ through $R^{26}$, $X_{21}$ through $X_{26}$ and $A_1$ through $A_6$ are each a hydrogen atom or a substituent, they may be the same or different; and the sum of the steric parameters $Es_{R21}$ through $Es_{R26}$ of $R^{21}$ through $R^{26}$ satisfies the following expression:

$$Es_{R21}+Es_{R22}+Es_{R23}+Es_{R24}+Es_{R25}+Es_{R26} \leq -2.0.$$

8. The organic electro-luminescent element of item 1, wherein $R^1$ and $R^2$ are each an alkyl or alkoxy group or halogen atom, and Ar is a naphthyl, binaphthyl, quinolyl, iso-quinolyl, benzoxazolyl or benzimidazolyl group, wherein each of $R^1$, $R^2$ and Ar may have a substituent.
9. The organic electro-luminescent element of item 4, wherein $R^3$ is halogen atom, an alkyl group, a cycloalkyl group, an aralkyl group, an aryl group, an alkoxy group, an aryloxy group, and a heterocyclic group, each of which may have a substituent.

10. The organic electro-luminescent element of item 5, wherein $R^4$ and $R^5$, which may be same or different, each represents a halogen atom, an alkyl group, a cycloalkyl group, an aralkyl group, an aryl group, an alkoxy group, an aryloxy group, a cyano group and a heterocyclic group, each of which may have a substituent.

11. The organic electro-luminescent element of item 6, wherein $R^6$, $R^7$ and $R^8$ each represents a methyl or naphthyl group.

12. The organic electro-luminescent element of item 1, wherein organic compound layer is provided between a cathode and an anode.

13. A display apparatus comprising a plural number of organic electro-luminescent element of item 1 on a support.

In the figures, 1 is spectrum of fluorescent light, 2 is a spectrum of excitation and 3 is the spectral absorbance of the compound.

DETAILED DESCRIPTION OF THE INVENTION

The invention is described in detail below.

Figure 4:
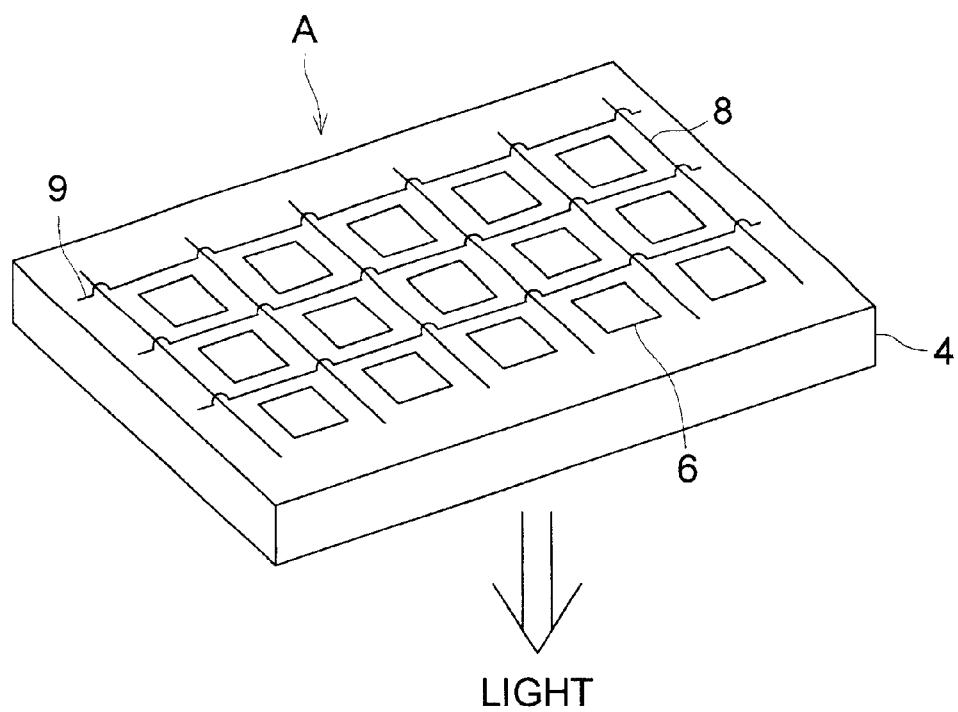
FIG. 4 is a schematic drawing of a displaying part.

Color of light emitted from the organic compound according to the invention is measured by a spectral irradiation photometer CS-1000, manufactured by Minolta Co., Ltd., and expressed according to CIE chromaticity diagram described in FIG. 4.16 on page 108 of "Shinpen Shikisai Kagaku Handbook" (Coloring Science Handbook, New Edition), edited by Nihon Shikisai Gakkai, published by Todai Shuppan Kai.

In the invention, the steric parameter Es is a substitution constant defined by Taft and described in, for example, "American Chemical Society Professional Reference Book Exploring QSAC", (C. Hansch and A. Leo et al., edited by S. R. Hell) and "Relation between Structure and Activity of Medicine" extra issue No. 122, Konando. In the invention, Es value is a value based on a hydrogen atom, namely the value of Es(H=0), and calculated by subtracting 1.24 from the value of Es($CH_3$) based on a methyl group. Typical examples of the value are shown in Table 1.

TABLE 1

Typical examples of steric parameter Es

| Substituent | Es value |
| --- | --- |
| H | 0 |
| $CH_3$ | −1.24 |
| $C_2H_5$ | −1.31 |
| i-$C_3H_7$ | −1.71 |
| t-$C_4H_4$ | −2.78 |
| F | −0.46 |
| Cl | −0.97 |
| Br | −1.16 |
| $CF_3$ | −2.40 |
| $CCl_3$ | −3.30 |
| $OCH_3$ | −0.55 |
| OH | −0.55 |
| SH | −1.07 |
| CN | −0.51 |

Examples of Es are described in Prog. Org. Chem., 12, 91 (1976), by S. H. Uriger, and C. Hansch.

The "cathode buffer layer" in the invention is a layer provided between the cathode and the organic compound layer to lower the driving voltage and raise the light emission efficiency. Detail of such the layer is described in, for example, JP O.P.I. Nos. 6-325871, 9-17574 and 10-74586. Concrete examples of the cathode buffer layer include a metal buffer layer such as strontium and aluminum, an alkali metal compound buffer layer such as lithium fluoride, an alkali-earth metal compound buffer layer such as magnesium fluoride and an oxide buffer layer such as aluminum oxide.

The buffer layer is preferably a very thin layer. The thickness of the layer is preferably within the range from 0.1 to 100 nm, the thickness may be changed depending on the material of the layer.

The compounds represented by Formulas I through VI according to the invention are described in detail below.

In Formula I, $R^1$ and $R^2$ each represents hydrogen atom or a substituent. The substituent is preferably an alkyl group such as a methyl group, an ethyl group, an i-propyl group, a hydroxyethyl group, a methoxymethyl group, a trifluoromethyl group and a t-butyl group, a halogen atom such as a fluorine atom and a chlorine atom, and an alkoxy group such as a methoxy group, an ethoxy group, an i-propoxy group and a butoxy group. Ar represents an aromatic hydrocarbon ring or an aromatic heterocyclic ring; both of them bay have a substituent, preferably a naphthyl group, a binaphthyl group, a quinolyl group, an iso-quinolyl group, a benzoxazolyl group and benzimidazolyl group.

In Formula II, n1 is an integer of from 0 to 7 and one or more $R^3$ each represents a substituent, plural $R^3$ may be the same or different. Examples of the substituent include a halogen atom such as a fluorine atom and a chlorine atom; an alkyl group such as a methyl group, an ethyl group, an i-propyl group, a hydroxyethyl group, a methoxymethyl group, a trifluoromethyl group and a t-butyl group; a cycloalkyl group such as a cyclopentyl group and a cyclohexyl group; an aralkyl group such as a benzyl group and a 2-phenetyl group; an aryl group such as a phenyl group, a naphthyl group, a p-tolyl group and a p-chlorophenyl group; an alkoxy group such as a methoxy group, an ethoxy group, an i-propoxy group and a butoxy group; an aryloxy group such as a phenoxy group; a cyano group; and a heterocyclic group such as a pyrrole group, a pyrrolidyl group, a pyrazolyl group, an imidazolyl group, a pyridyl group, a benzimidazolyl group, a benzothiazolyl group and a benzoxazolyl group. The foregoing groups further may have a substituent.

In Formula III, n2 represents an integer of from 0 to 6 and n3 represents an integer of from 0 to 7. One or more $R^4$ and $R^5$ each represents a substituent, when $R^4$ and $R^5$ are each plural, they may be the same or different. The substituent may be the same as those described as the substituents represented by $R^3$. The substituents further may have a substituent.

In Formula IV, n4, n5 and n6 each represents an integer of from 0 to 7. One or more $R^6$, $R^7$ and $R^8$ each represents a substituent selected from an alkyl group, a cycloalkyl group, an aryl group, a halogen atom, an alkoxyl group and aryloxy group and a heterocyclic group; and a methyl group and a naphthyl group are particularly preferred.

When n1 through n6 each represents an integer of 2 or more, plural $R^3$ through $R^8$ each may be the same of different.

In Formulas V and VI, $R^{11}$ through $R^{16}$, $R^{21}$ through $R^{26}$, $X_1$ through $X_2$ and $A_1$ through $A_6$ each represents a hydrogen atom or a substituent, each of which may be the same or different. Examples of the substituent are the same as those described as the substituents represented by of $R^3$ and the substituents each further may have a substituent. Provided that the sum of the steric parameter $Es_{R11}$ through $Es_{R16}$ of $R^{11}$ through $R^{16}$ satisfies the following expression:

$Es_{R11}+Es_{R12}+Es_{R13}+Es_{R14}+Es_{R15}+Es_{R16} \leq -2.0;$ and the sum of the steric parameter $Es_{R21}$ through $Es_{R26}$ of $R^{21}$ through $R^{26}$ satisfies the following expression:

$Es_{R21}+Es_{R22}+Es_{R23}+Es_{R24}+Es_{R25}+Es_{R26} \leq -2.0.$

The adjacent substituents may be condensed with together to form a ring structure. The substituent represented by $X_1$ through $X_9$ is preferably an alkyl group, an aryl group, a heterocyclic group, a halogen atom, an alkoxyl group and an amino group. $X_2$, $X_5$ and $X_8$ are each preferably an aryl group or an amino group, particularly a diarylamino group. The substituents represented by $A_1$ through $A_6$ are each preferably an aryl group which may have a substituent.

Two of $A_1$ through $A_6$, such as combinations of $A_1$ and $A_2$, $A_3$ and $A_4$, and $A_5$ and $A_6$, may form a ring by condensation each other. The aryl group represented by $A_1$ through $A_6$ may be a single ring or condensed ring. Preferable example of the aryl group represented by $A_1$ through $A_6$ includes a phenyl, 1-naphthyl, 2-naphthyl, 9-antholyl, 1-antholyl, 9-phenantholyl, 2-triphenylenyl, pyridyl, quinolyl and thienyl group, each of which may have a substituent.

Concrete examples of compound represented by Formulas I to VI according to the invention are shown below, however, the compound usable in the invention is not limited thereto.

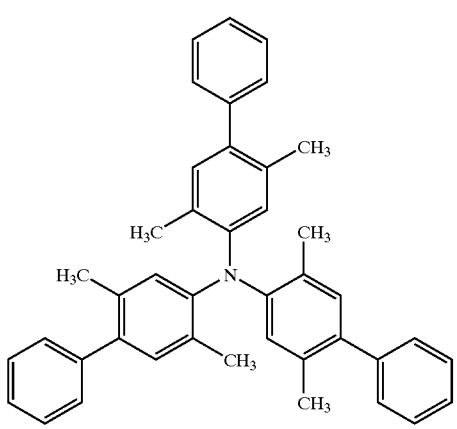

(1)

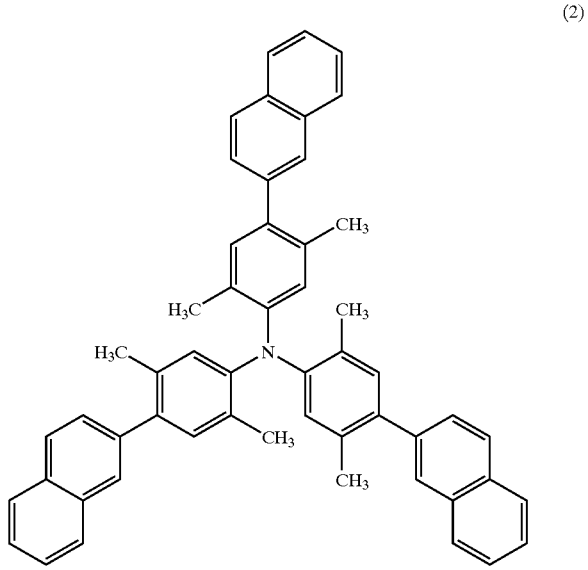

(2)

-continued
(3)
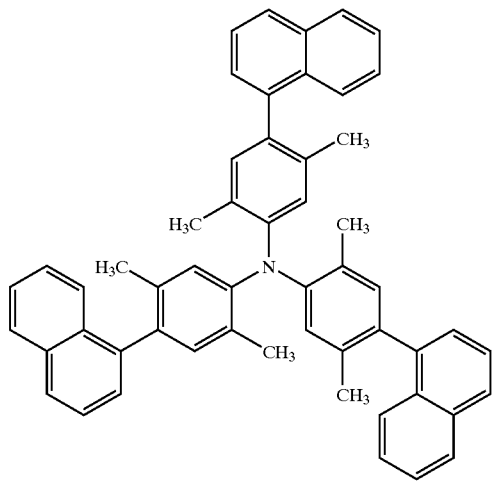
(4)
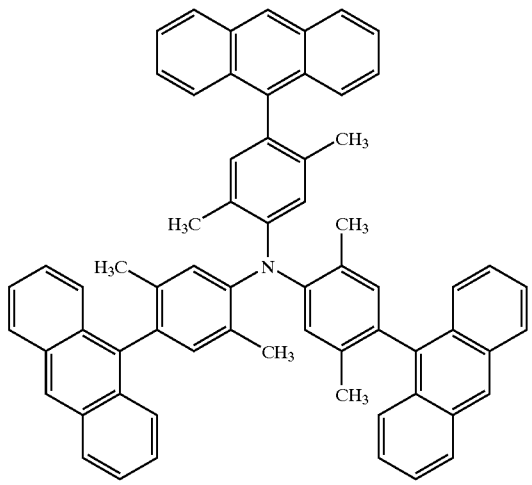
(5)
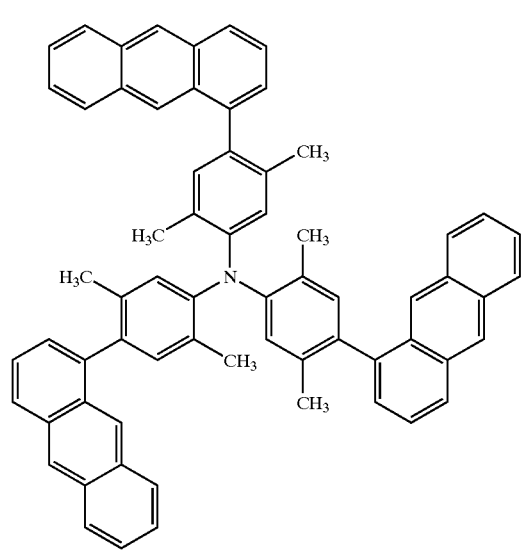
(6)
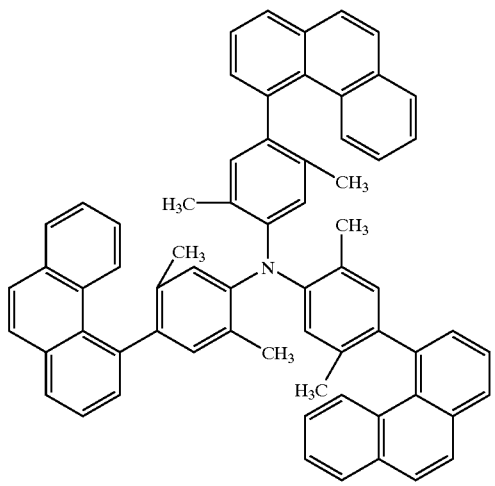
(7)
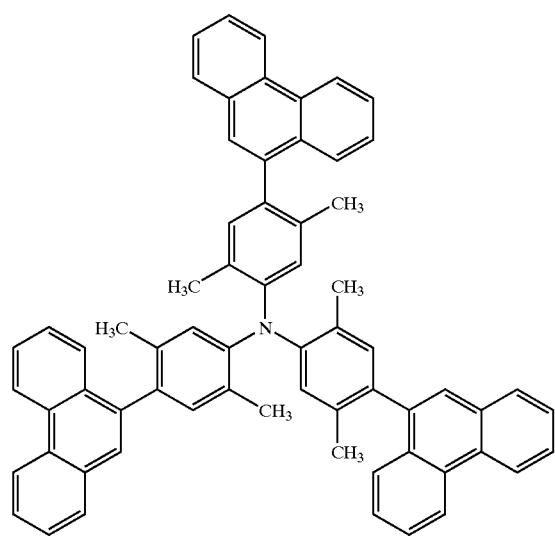
(8)
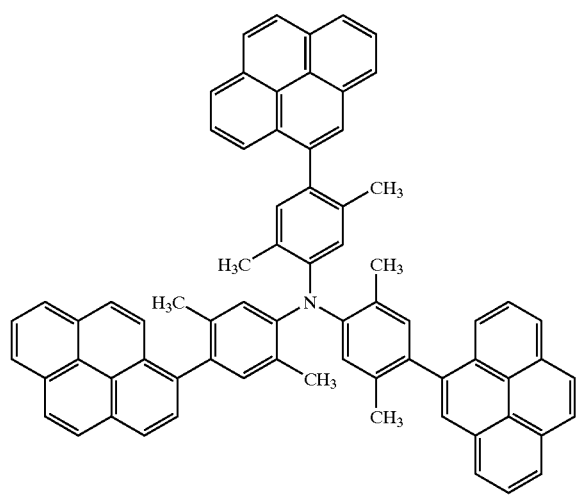

-continued
(9)
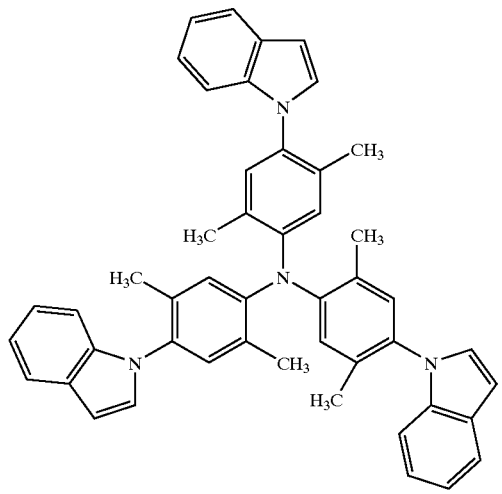
(10)
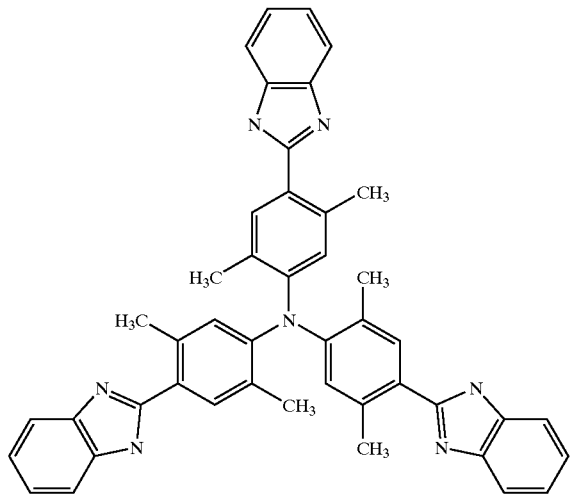
(11)
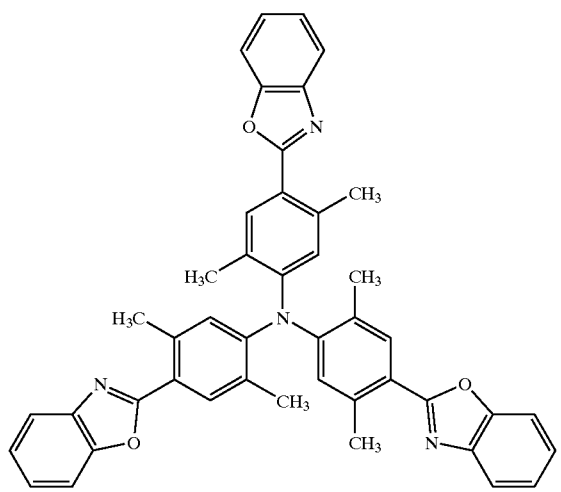
(12)
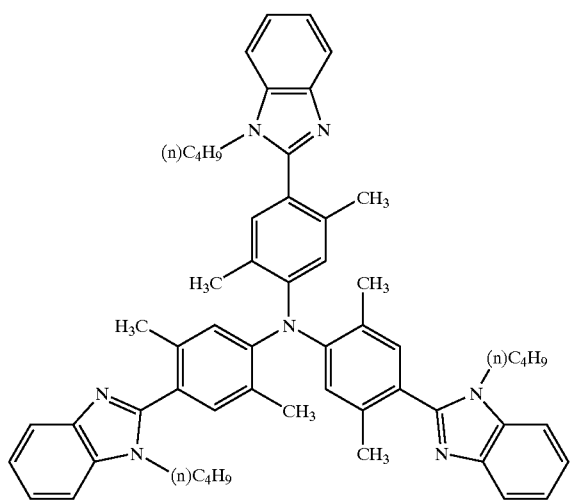
(13)
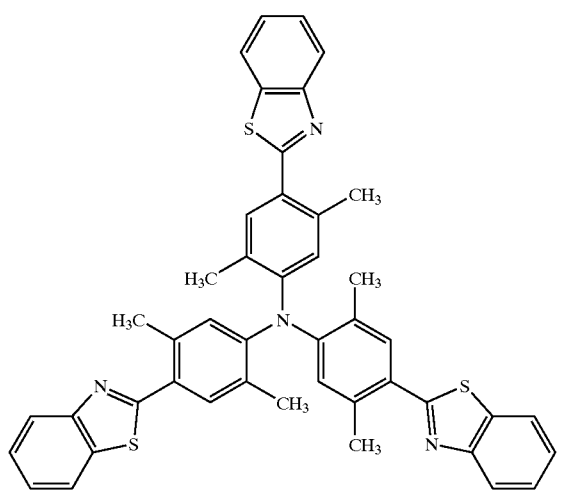
(14)
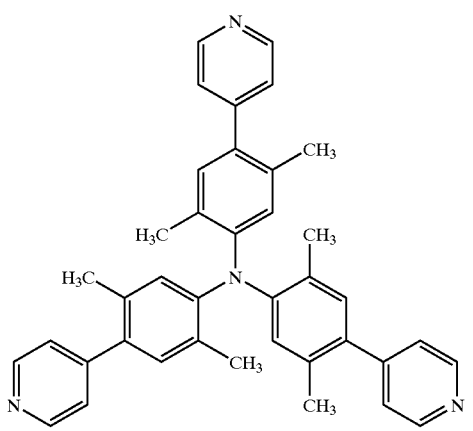

(15)
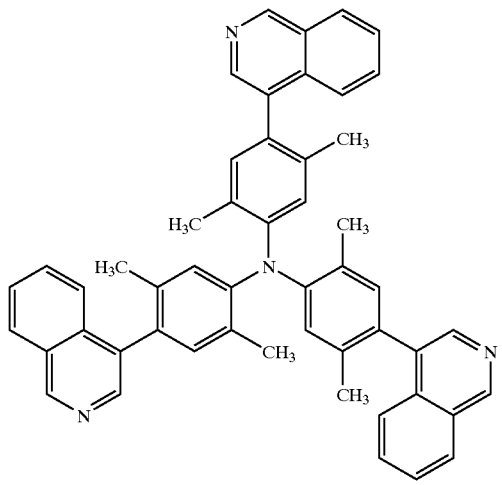
(16)
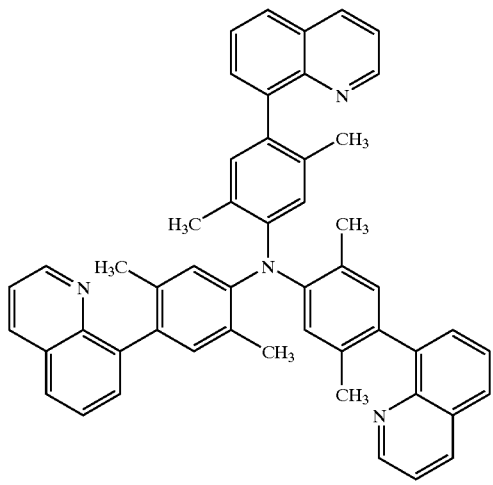
(17)
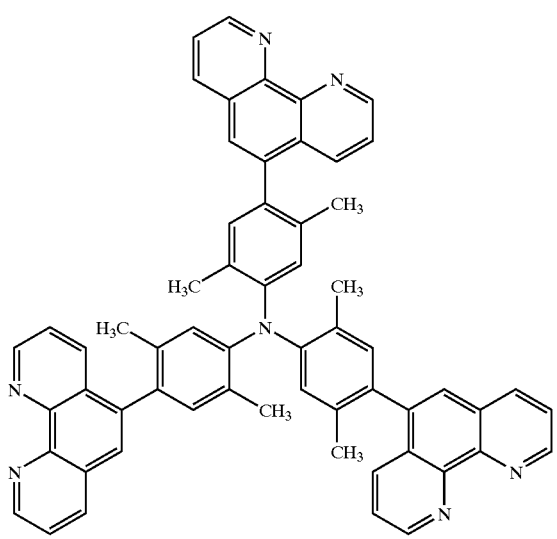
(18)
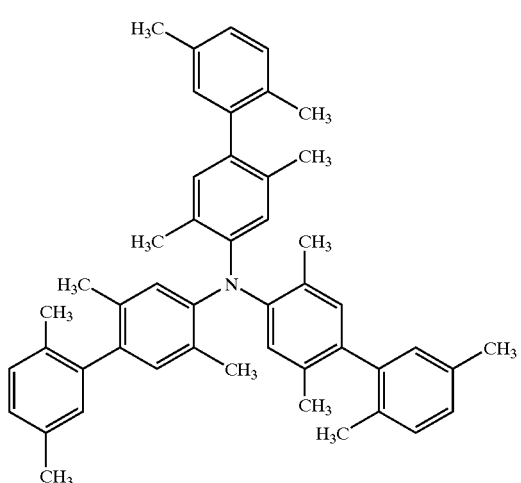
(19)
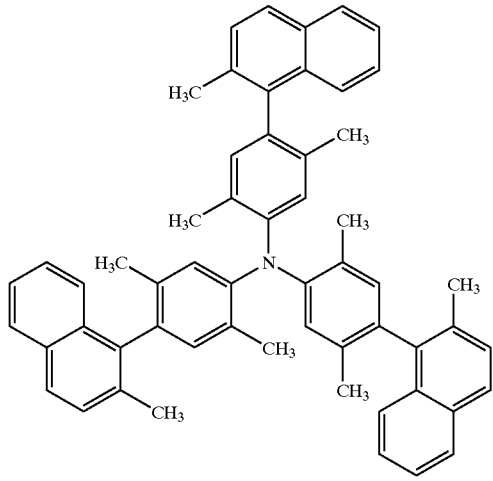
(20)
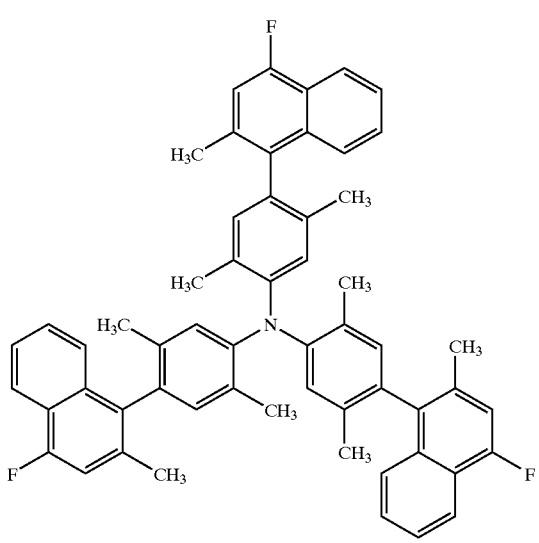

-continued
(21)
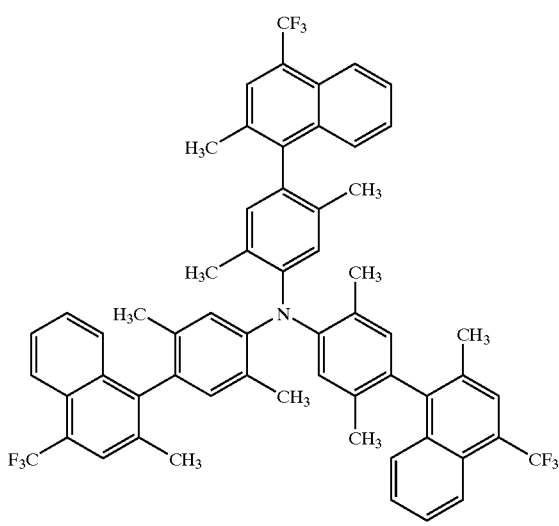
(22)
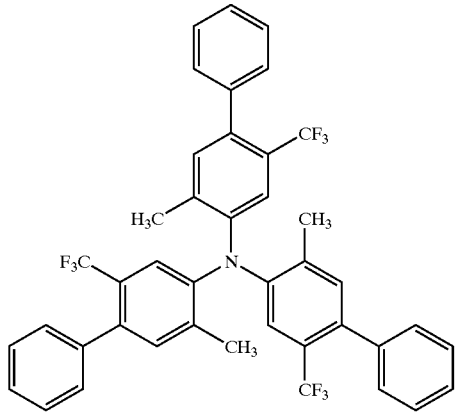
(23)
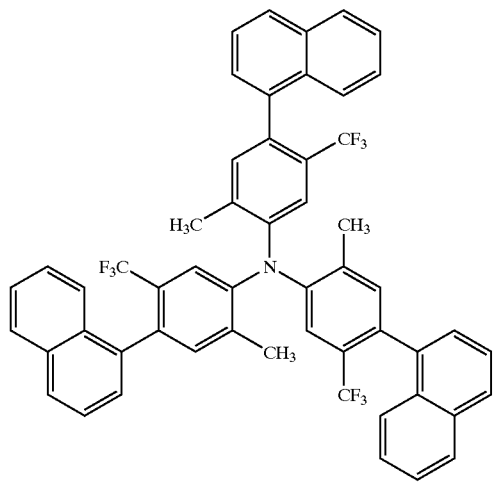
(24)
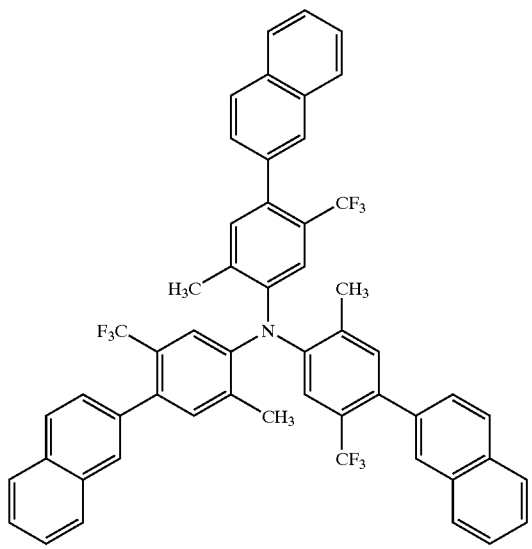
(25)
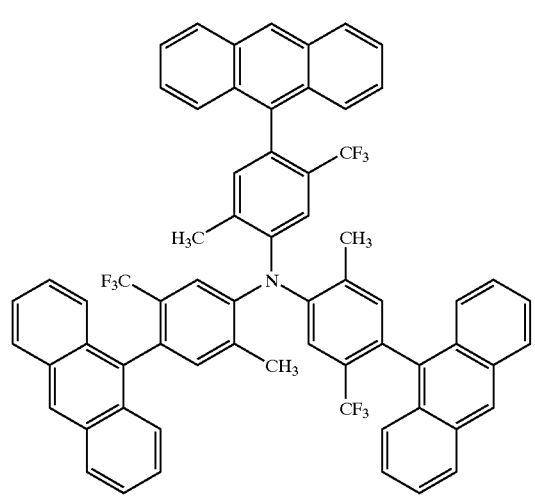
(26)
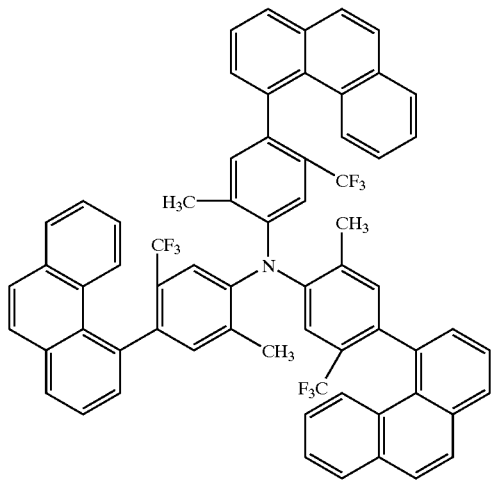

-continued
(27)
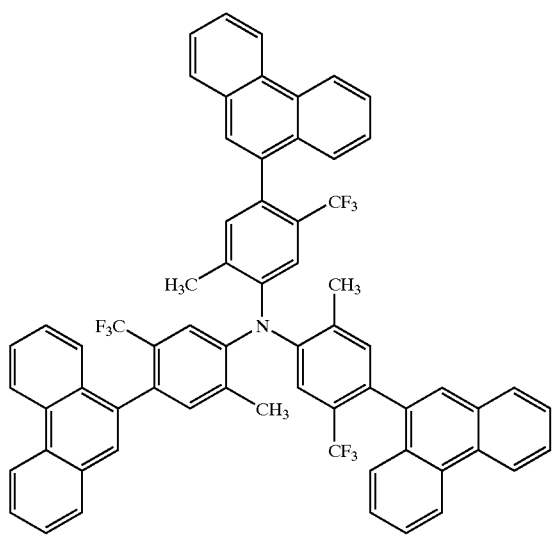
(28)
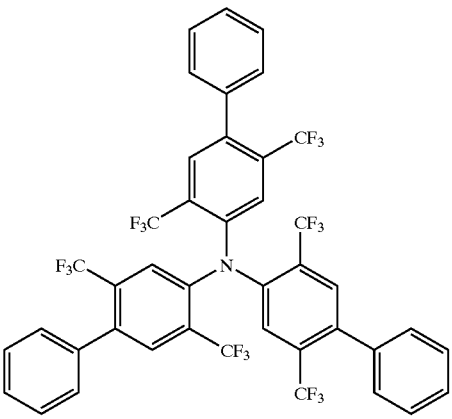
(29)
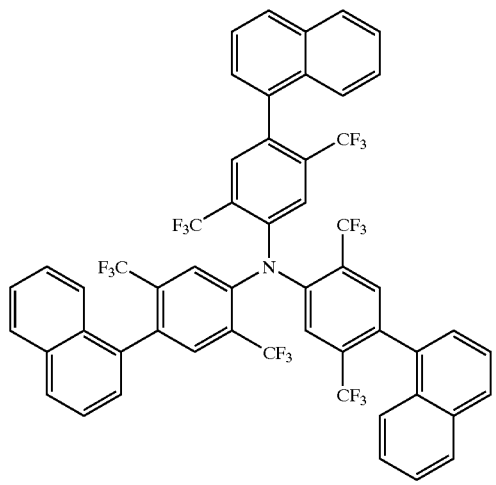
(30)
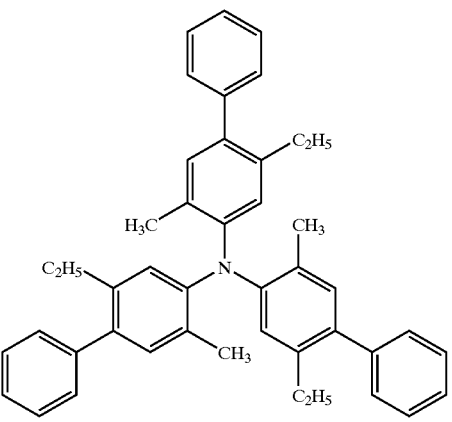
(31)
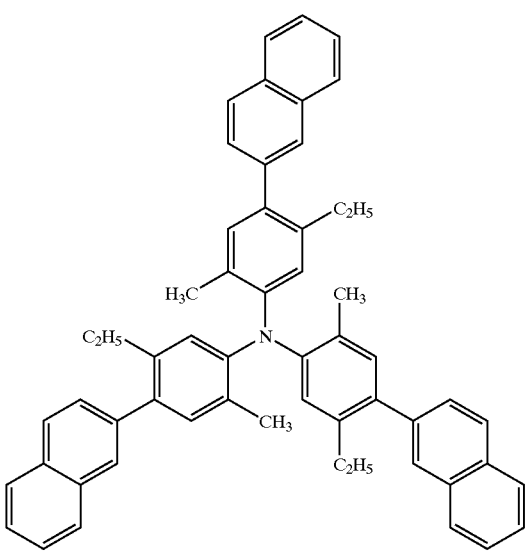
(32)
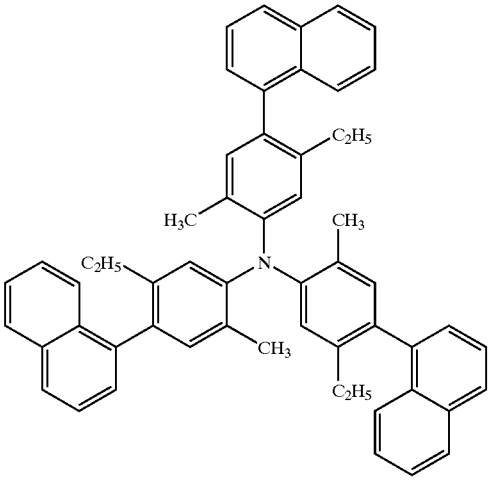

-continued
(33)
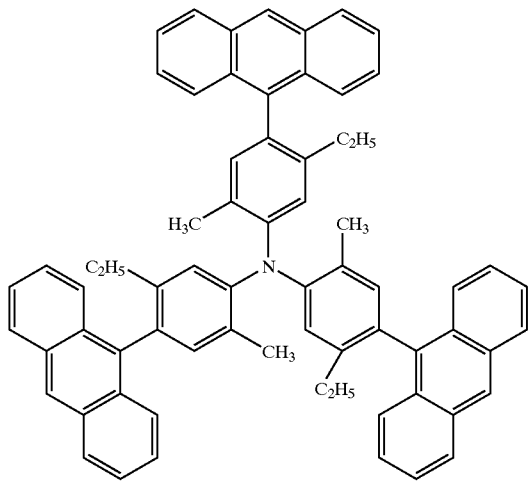
(34)
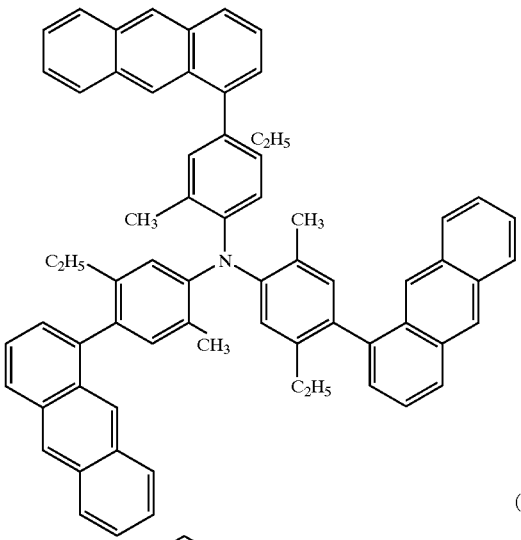
(35)
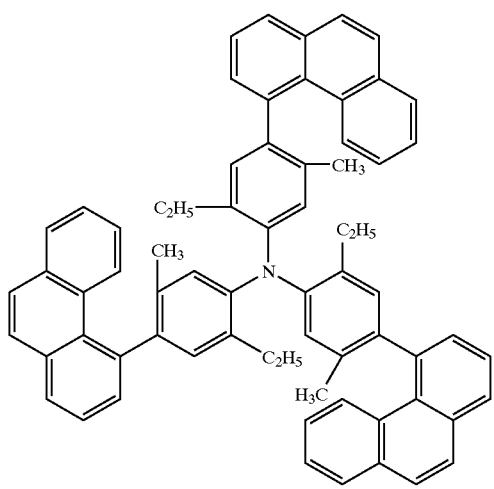
(36)
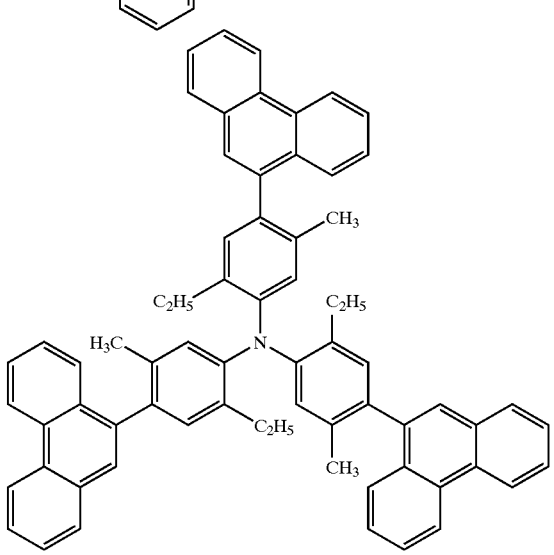
(37)
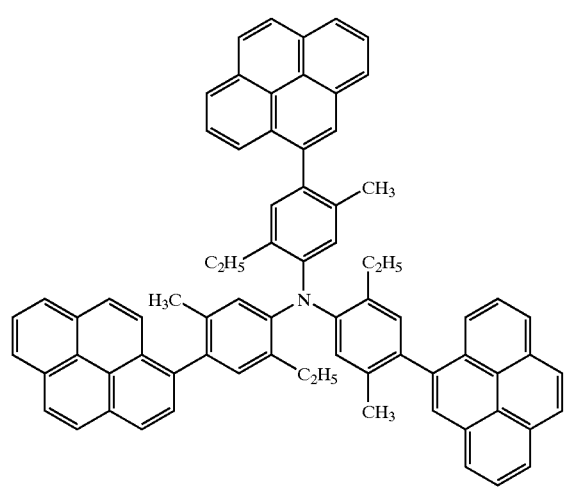
(38)
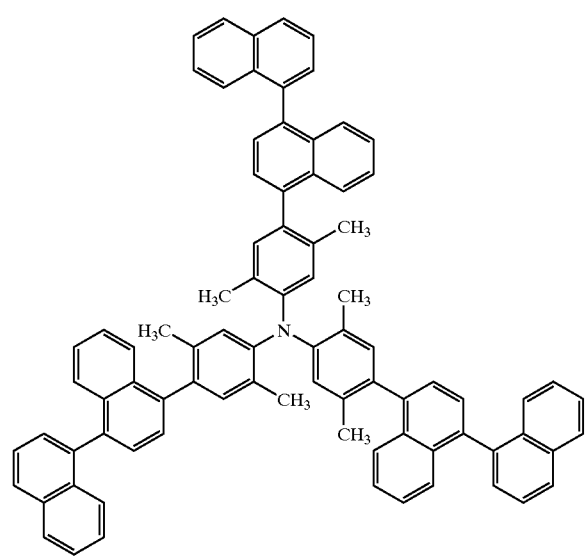

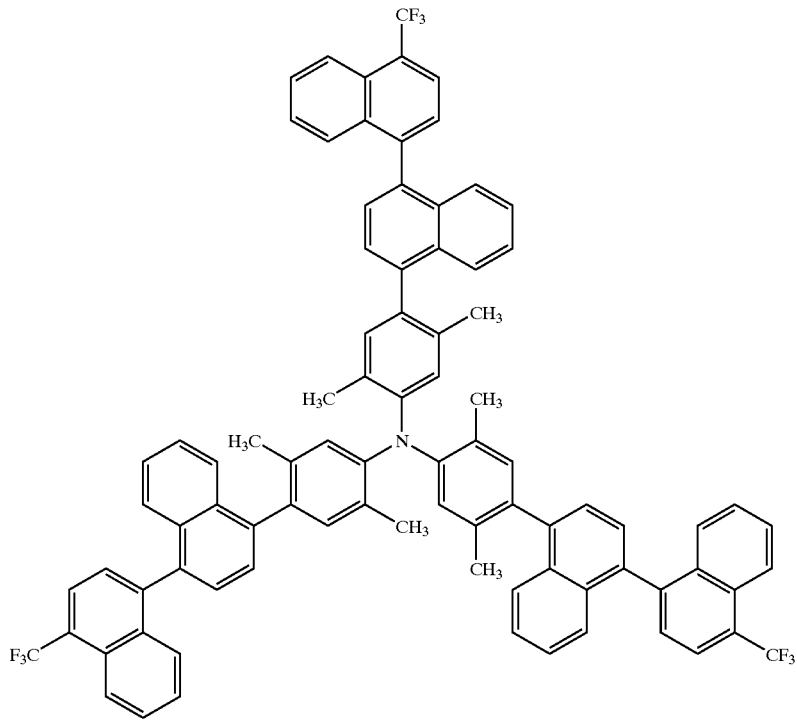
(39)
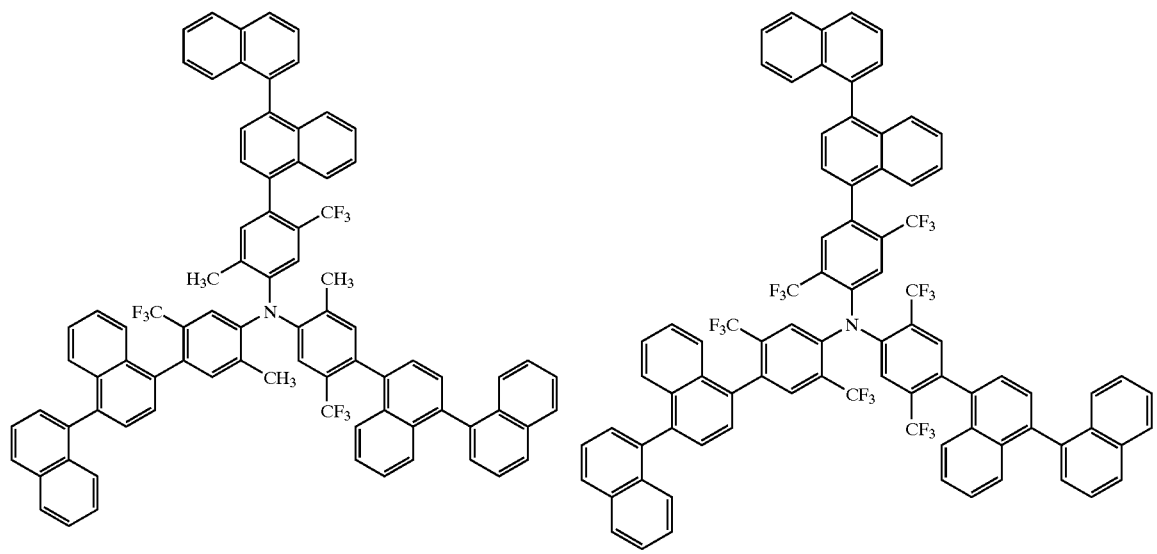
(40) (41)

(42)
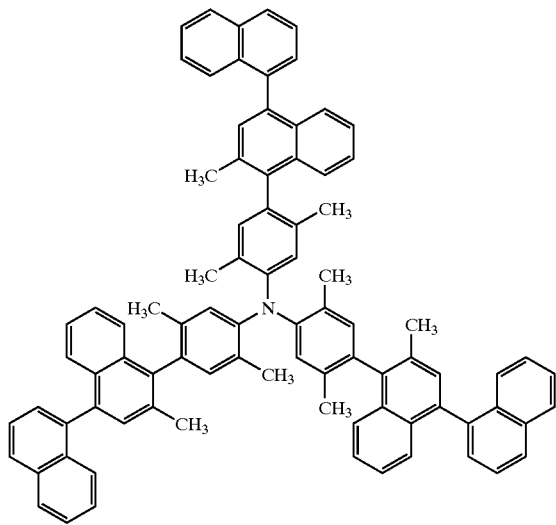
(43)
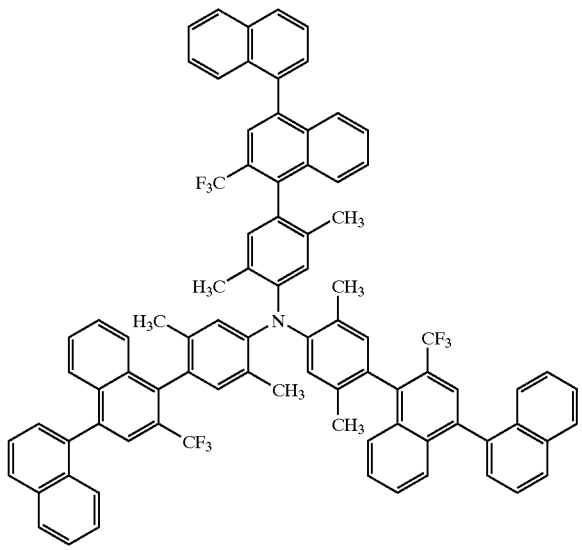
(44)
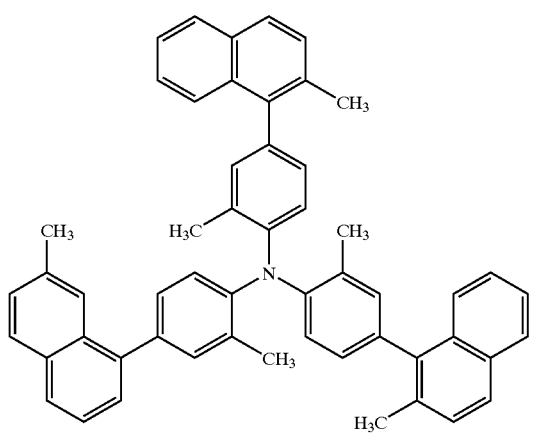
(45)
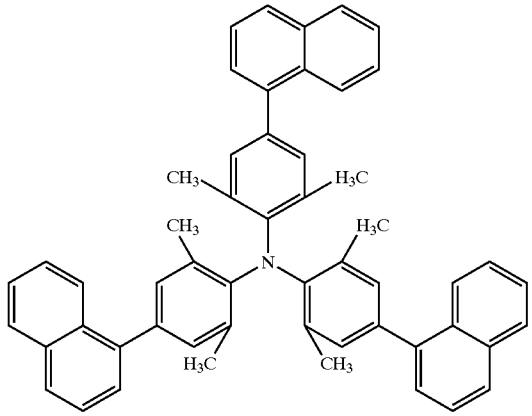
(46)
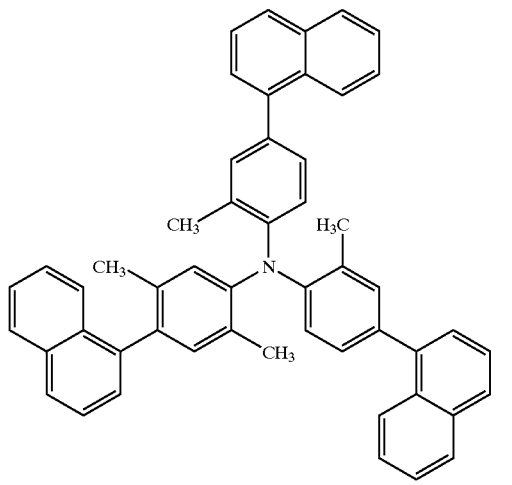
(47)
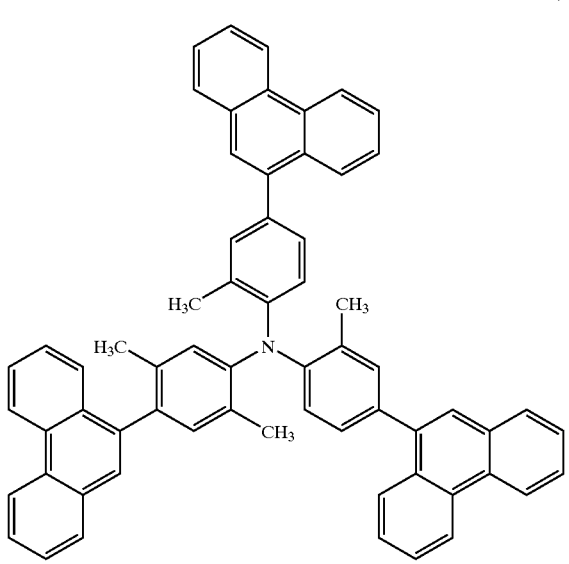

(48)
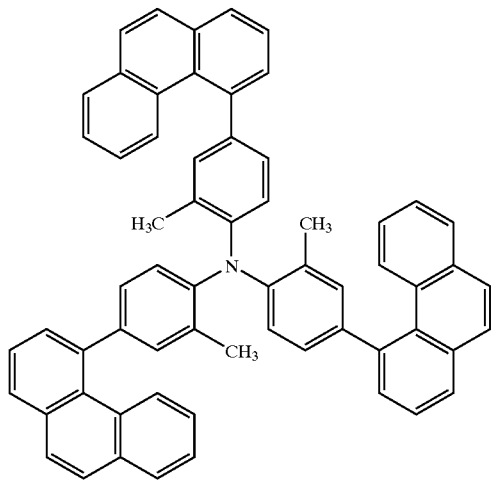
(49)
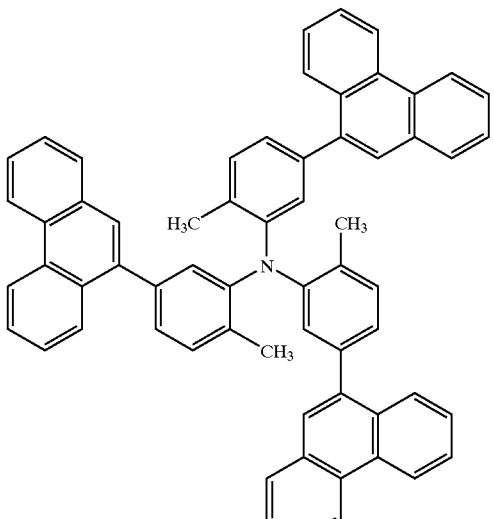
(50)
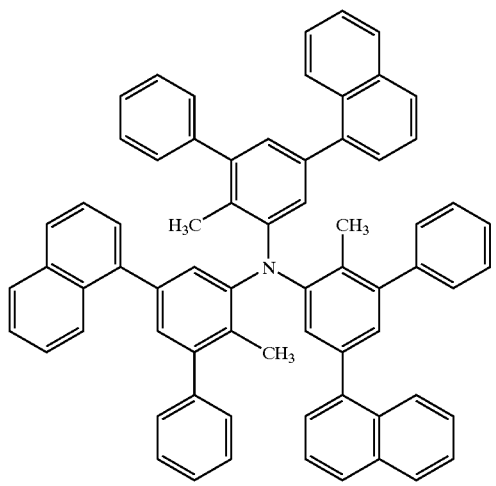
(51)
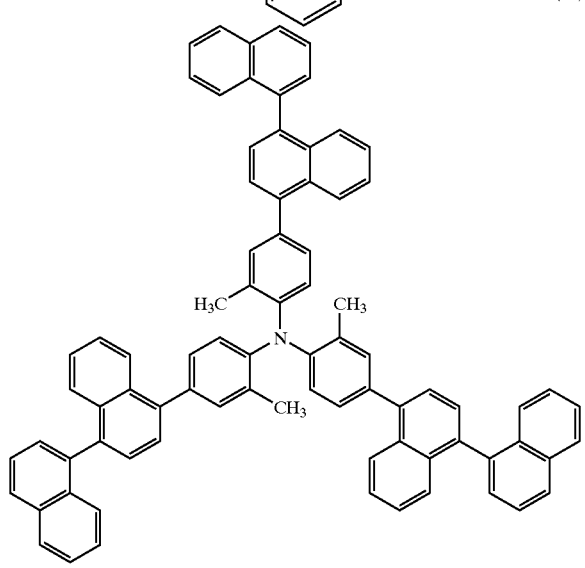
(52)
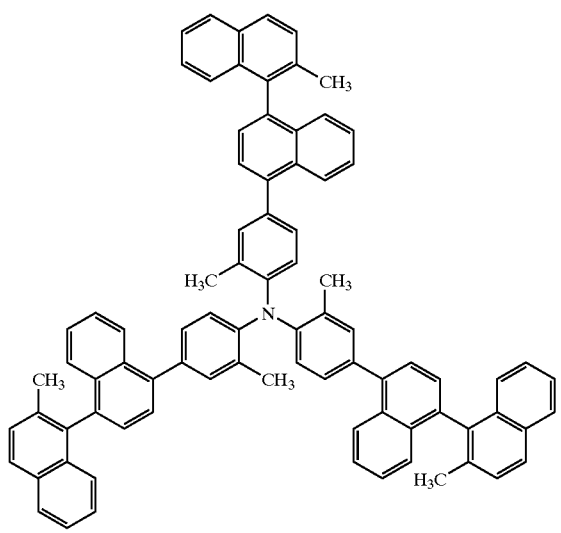
(53)
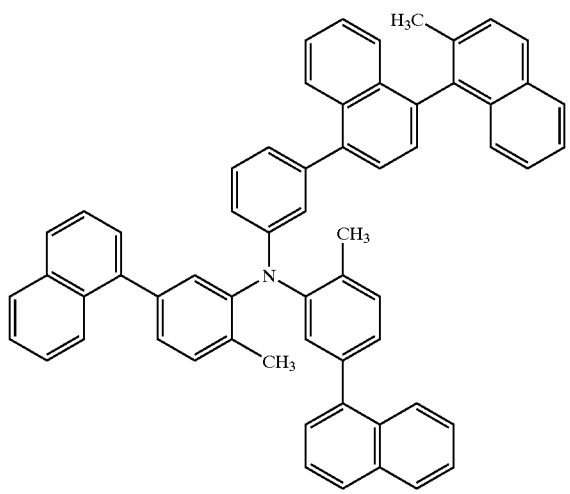

-continued
(54)
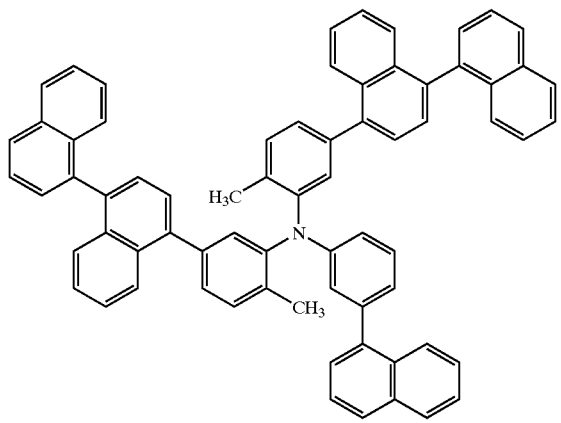
(55)
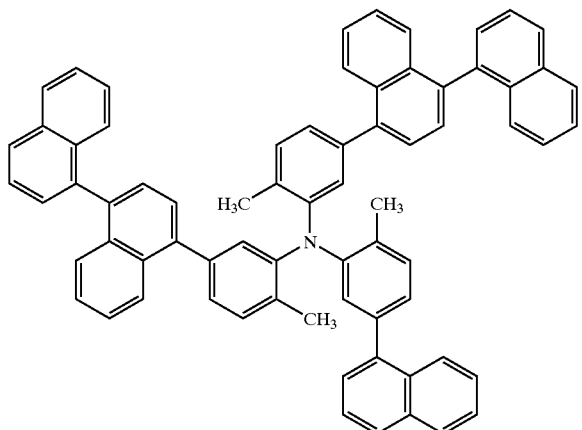
(56)
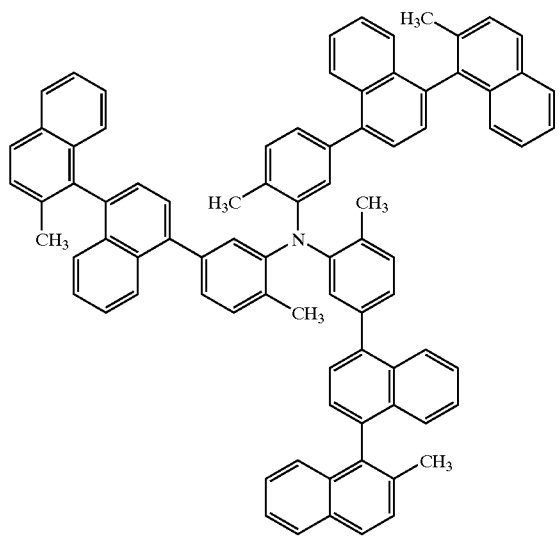
(57)
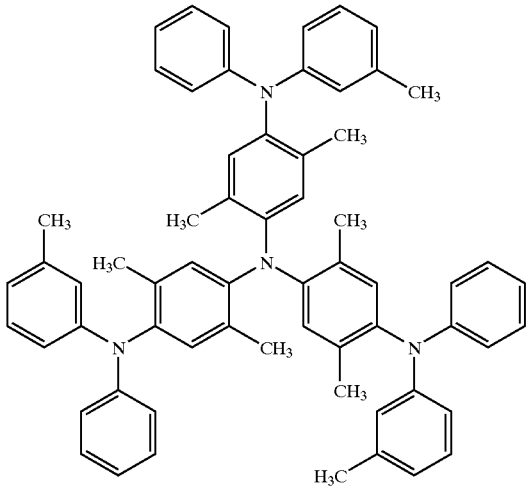
(58)
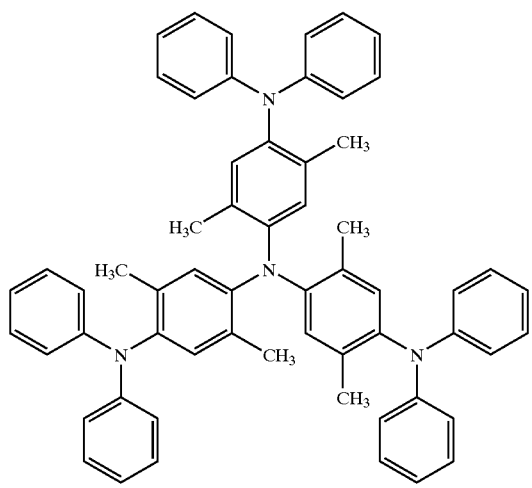
(59)
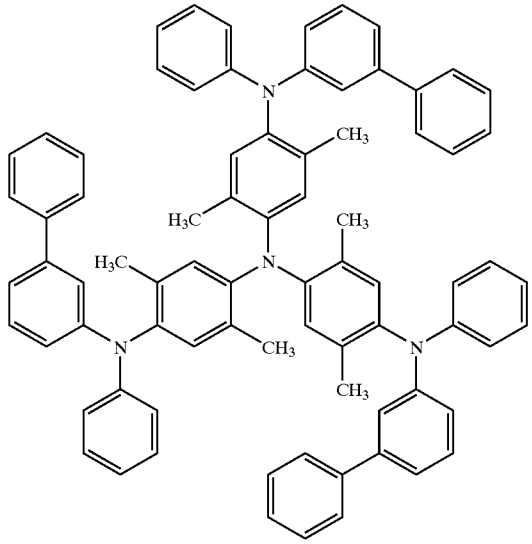

(60)
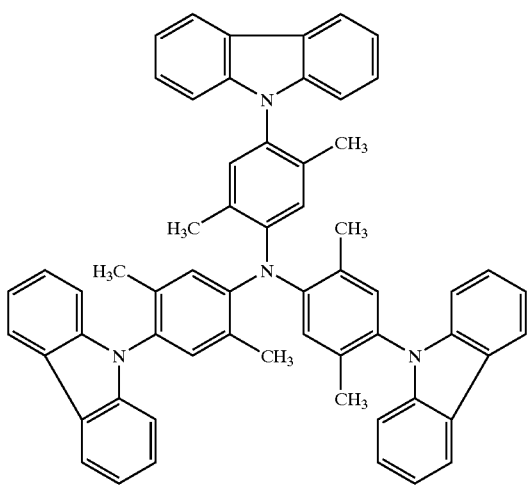
(61)
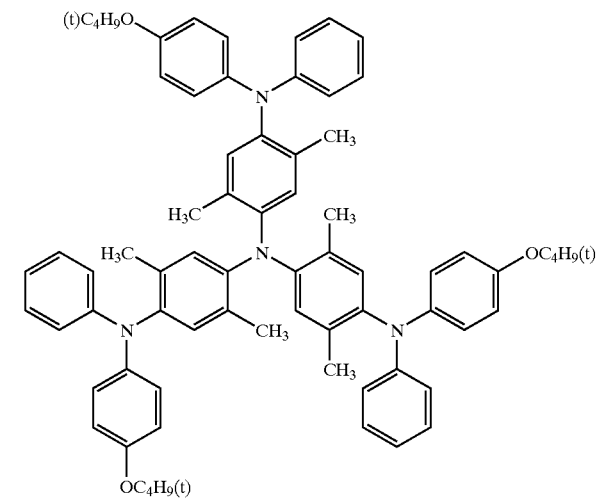
(62)
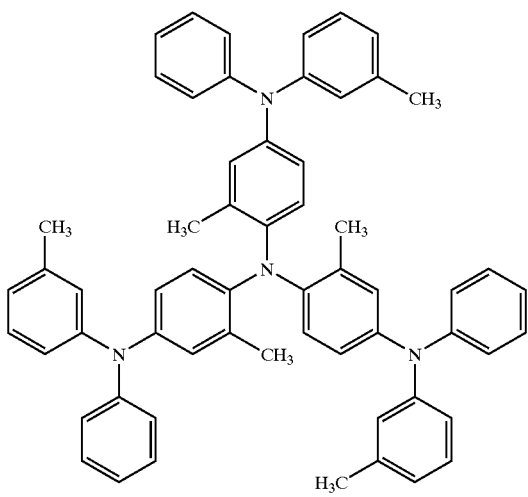
(63)
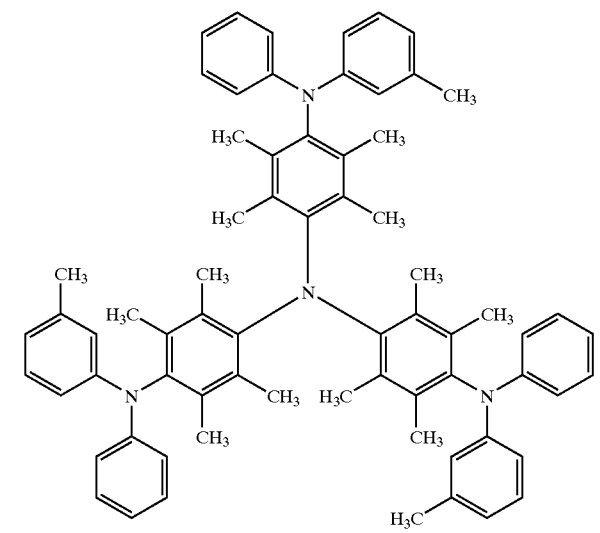
(64)
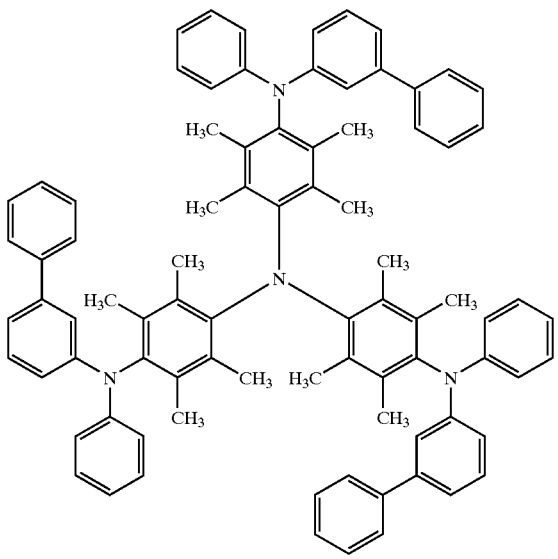
(65)
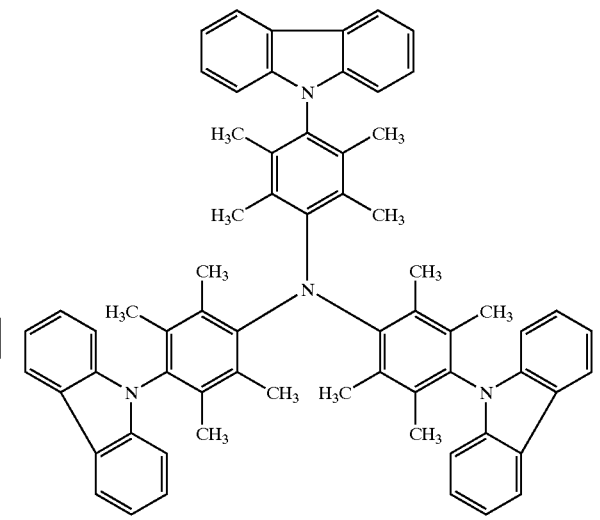

(66)
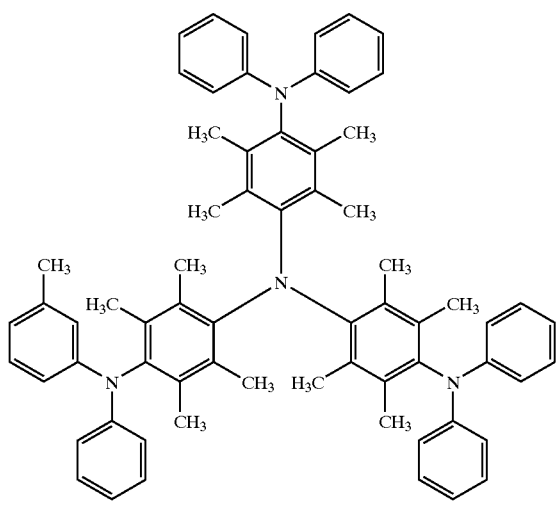

(67)
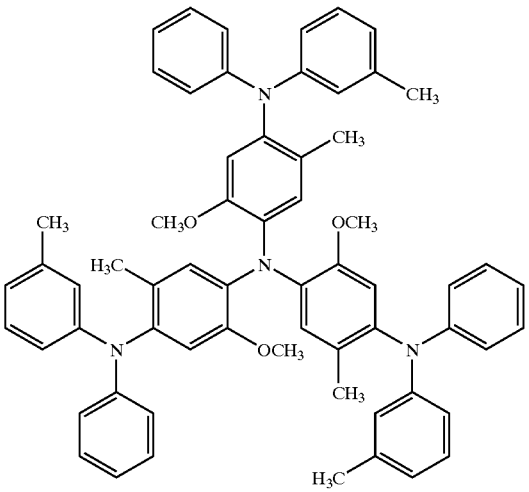

(68)
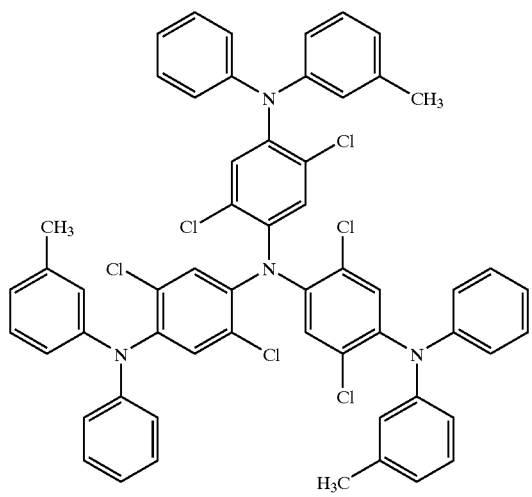

The organic EL element in the invention basically has a structure in which a light emission layer is put between a pair of electrodes and a positive hole injection layer or an electron injection layer is provided according to necessity.

In concrete, the following structures are included.

(I) Anode/Light emission layer/Cathode
(II) Anode/Positive hole transporting layer/Light emission layer/Cathode
(III) Anode/Light emission layer/Electron transporting layer/Cathode
(VI) Anode/Positive hole transporting layer/Light emission layer/Electron transporting layer/Cathode
(V) Anode/Positive hole injection layer/Light emission layer/Cathode buffer layer/Cathode
(VI) Anode/Positive hole injection layer/Light emission layer/Electron injection layer/Cathode buffer layer/Cathode A substrate preferably employed for the organic electroluminescent element is not restricted to specific kinds and includes glass and plastic, as far as it is transparent. Example of the substrate preferably employed for the organic electroluminescent element of the invention includes glass, quartz and light transmissible plastic film. The substrate of the element may be a flexible transparent plastic film for avoiding the damage caused by the shock such as falling when the element is used as the portable tool.

Examples of the light transmissible plastic film include films such as polyethyleneterephthalate (PET), polyethylenenaphthalate (PEN), polyethersulfone (PES), polyetherimide, polyetheretherketone, polyphenylenesulfide, polyarylate, polycarbonate (PC), cellulose triacetate (TAC), cellulose acetate propionate (CAP) and so on.

The light emission layer is a layer emitting light by recombination of an electron and a hole injected from the electron transporting layer and hole charge transporting layer. The light emitting part can be within the light emission layer or interface between the light emission layer and thee neighboring layer.

There is no limitation on the kind of the material employed in the light emission layer (called a light emission material hereafter) to be used in the light emission layer, and ones know as the light emission material in the organic EL element may be used. Such the light emission materials are mainly organic compounds, for example, the compounds described in Macromol. Synth., Vol. 125, p.p. 17–25 are usable according to required color.

The light emission material may have a hole transporting function or electron transporting function in addition to the light emission property, and almost all of the hole charge transporting materials or electron transporting materials are used for the light emission materials.

The light emission material may be composed of polymer material such as p-polyphenylenevinylene or polyfluorene, or polymer materials to which a light emitting material is introduced in its main chain, or polymer materials having the light emitting material as the main chain of the polymer.

A doping agent (a guest material) may be incorporated in the light emission layer, which is selected from any doping agents known to be used for the EL elements.

Concrete examples of the doping agents include quinacridone, DCM, coumarin derivative, Rhodanine, rub Rene, decacyclene, pyrazoline derivative, squarilium derivative, europium complex and so on.

The emission layer can be prepared employing materials mentioned above by a known method such as a evaporation method, a spin-coat method, a casting method and a LB method to form thin film. Thickness of the layer is not limitative and selected from 5 nm to 5 µm usually.

The light emitting layer can be formed by a single layer composed of one or two or more light emitting material, or by plurality layers composed of singular or plurality materials.

Moreover, the light emission layer can be formed by the method such as that described in JP O.P.I. No. 57-51781, by which the light emission material is dissolved in a solvent together with a binder such as a resin, and thus obtained solution is formed into a thin layer by a method such as spin-coat method. Thickness of the emission layer thus prepared is not specially restricted. It is preferred that the thickness is within the range of from 5 nm to 5 µm, although the thickness of the layer thus formed may be optionally selected according to necessity without any limitation.

A buffer layer (an electrode interface layer) may be provided between the anode and the light emission layer or the hole charge transporting layer, or between the cathode and the light emission layer or the electron transporting layer.

The buffer layer is a layer provided for the purpose of reducing the driving voltage or improvement of light emission efficiency between the electrode and an organic layer. It includes an anode buffer layer and a cathode buffer layer, and is described in "Electrode Material" page 123, Div. 2 Chapter 2 of "Organic EL element and its frontier of industrialization" (published by NTS Corporation, Nov. 30, 1998) in detail.

The anode buffer layer is described in JP O.P.I. No. 9-45479, 9-260062, 8-288069 etc., and its example includes a phthalocyanine buffer layer represented by copper phthalocyanine, an oxide buffer layer represented by vanadium oxide, an amorphous carbon buffer layer, a polymer buffer layer employing an electroconductive polymer such as polyamine (emeraldine), polythiophene etc.

The cathode buffer layer is described in JP O.P.I. No. 6-325871, 9-17574, 9-74586 etc. in detail, and its example includes a metal buffer layer represented by strontium and aluminum, an alkali metal compound buffer represented by lithium fluoride, an alkali earth metal compound buffer layer represented by magnesium fluoride, and an oxide buffer layer represented by aluminum oxide.

Examples of the cathode buffer layer include, practically, a metal buffer layer, an alkali metal compound buffer, an alkali earth metal compound buffer, and oxide buffer mentioned above.

The buffer layer is preferably very thin layer having thickness of from 0.1 to 100 nm depending on the material.

A layer having another function may be provided if necessary in addition to the fundamental configuration layers, for example a hole blocking layer may be added as described in JP O.P.I. Nos. 11-204258, 11-204359, page 337 of "Organic EL element and its frontier of industrialization" (published by NTS Corporation, Nov. 30, 1998).

For the anode of the electro luminescent element, a metal, an alloy and an electroconductive compound each having a high working function of not less than 4 eV, and mixture thereof are preferably used as the electrode material. Concrete examples of such the electrode material include a metal such as Au, and a transparent electroconductive material such as CuI, indium oxide (ITO), $SnO_2$, ZnO and Zn-doped indium oxide (IZO).

The anode may be prepared by evaporating or spattering such the electrode material to form a thin layer, and forming the layer into a desired form by a photolithographic method. When required precision of the pattern is not so high (not less than 100 mm), the pattern may be formed by evaporating or spattering through a mask having a desired form. When light is output through the anode, it is desired that the transparence of the anode is 10% or more, and the sheet resistivity of the anode is preferably not more than several hundreds $\Omega/\square$. It is preferably within the range of from approximately 10 nm to 1 µm, more preferably from 10 to 200 nm, although the thickness of the anode may be optionally selected.

On the other hand, for the cathode, a metal (also referred to an electron injection metal), an alloy, and an electroconductive compound each having a low working function (not more than 4 eV), and a mixture thereof is used as the material of electrode. Concrete examples of such the electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture and a rare-earth metal. Among them, a mixture of an electron injection metal and a metal higher in the working function than that of the electron injection metal, such as the magnesium/silver mixture, magnesium/aluminum mixture, magnesium/indium mixture, aluminum/aluminum oxide ($Al_2O_3$) mixture and lithium/aluminum mixture, is suitable from the view point of the electron injection ability and the resistivity to oxidation.

The cathode can be prepared by making such the material to a thin layer by a method such as an evaporation or spattering method. The sheet resistivity of the cathode is preferably not more than several hundred $\Omega/\square$, and the thickness of the cathode is preferably from 10 nm to 1 µm, more preferably from 50 to 2,000 nm.

In case that a cathode buffer layer is provided between the organic compound layer and the cathode the metal used as he cathode does not necessarily have low work function, for example, a metal having high working function such as aluminum can be used. Further, it is possible to use a non-metal electronically conductive material such as ITO mentioned above can be used.

It is preferable for raising the light emission efficiency that the electrode arranged between the light emission layer and the color conversion layer is transparent or semi-transparent so as to permeate light therethrough.

In the invention, a positive hole charge transporting layer, which may be provided according to necessity, has a function of transporting the positive hole injected from the anode to the light emission layer. Many positive holes can be injected in a lowered electric field by the presence of the positive hole injection layer between the anode and the light emission layer. Moreover, the light emission ability of the element is made excellent by raising the light emission efficiency since the electrons injected into the light emission layer from the cathode or the electron injection layer are accumulated at the interface in the light emission layer by a barrier to electron existing at the interface between the light emission layer and the positive hole injection layer.

The material to be used for the positive hole charge transporting layer (hereinafter referred to a positive hole charge transporting material) can be optionally selected from known materials without any limitation as far as having preferable property mentioned above, such materials as those employed for hole charge transporting materials conventionally or known material for EL element in the hole injection layer.

The positive hole injection material may be either an organic substance or an inorganic substance as long as it has positive hole injection ability or an ability to form a barrier to electron. Examples of them include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, hydrazone derivative, stilbene derivative, silazane derivative, aniline copolymer, and electroconductive oligomer, particularly thiophene oligomer.

It is preferred to employ porphyrin compounds, aromatic tertiary amine compounds and styrylamine compounds, particularly, aromatic tertiary amine compounds in addition to the hole injection materials mentioned above. Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2'-bis(4-di-p-tolylaminophenyl)propane, 1,1'-bis(4-di-p-tolylaminophenyl)cyclohexane, N,N,N',N'-tetra-p-tolyl-4,4'-diaminobiphenyl, 1,1'-bis(4-di-p-tolylaminophenyl)-4-phenylcyclohexane, bis(4-dimethylamino-2-methylphenyl)-phenylmethane, bis(4-di-p-tolylaminophenyl)-phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N, N-diphenylaminostylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in JP O.P.I. No. 4-308688 such as 4,4',4"-tris[N-(3-methylphenyl)-N-phenylamino]-triphenylamine (MTDATA) in which three triphenylamine units are bonded in a starburst form.

Polymer material into which the material mentioned above is introduced at the polymer chain or polymer having the material as the main chain can be also used.

As the inorganic positive hole transporting material, p-Si and p-SiC are usable. The positive hole transporting layer can be formed by making the positive hole transporting material to a thin layer by a known method such as a vacuum evaporation method, a spin coat method a casting method and a LB method. The thickness of the positive hole transporting layer is preferably approximately from 5 nm to 5 µm even though there is no specific limitation thereon.

The hole transporting layer may be composed of single layer structure comprising one or two or more material mentioned above, or plural layers structure composed of single composition or disparate compositions.

The electron injection layer which is provided according to necessity is a layer having a function of transporting electrons injected to the cathode to the light emission layer. The material of the electron injection layer may be optionally selected from known compounds.

Examples of the material of the electron transporting layer (hereinafter referred to electron transporting material) include a nitro-substituted fluorene derivative, a diphenylquinone derivative, a thiopyran dioxide derivative, a heterocyclic tetracarboxylic acid anhydride such as naphthaleneperylene, a carbodiimide, a fluolenylidenemethane derivative, an anthraquinodimethane and enthrone derivative, and a oxadiazole derivative.

It is found by the inventors that a series of electron transmission compounds described in JP O.P.I. No. 59-194393 can be used as the electron injection material even though the compounds are described in the publication as the material for making the light emission layer.

Moreover, a thiadiazole derivative which is formed by substituting the oxygen atom in the oxadiazole ring of the foregoing oxadiazole derivative by a sulfur atom, arylamino- or alkylamino-substituted triazole derivatives and a quinoxaline derivative having a quinoxaline ring known as an electron withdrawing group are usable as the electron transporting material.

Polymer material into which the material mentioned above is introduced at the polymer chain or polymer having the material as the main chain can be also used.

A metal complex of 8-quinolynol derivative such as aluminum tris-(8-quinolynol) (Alq), aluminum tris-(5,7-dichloro-8-quinolynol), aluminum tris-(5,7-dibromo-8-quinolynol), aluminum tris-(2-methyl-8-quinolynol), aluminum tris-(5-methyl-8-quinolynol), zinc bis-(8-quinolynol) (Znq), and a metal complex formed by replacing the central metal of the foregoing complexes with another metal atom such as In, Mg, Cu, Ca, Sn, Ga or Pb, can be used as the electron transporting material. Furthermore, a metal free and metal-containing phthalocyanine, and a derivative thereof in which the terminal of each of the compounds is replaced by a substituent such as an alkyl group or a sulfonic acid group are also preferably used as the electron transporting material. Distyrylpyrazine derivative exemplified as a material for emission layer may preferably be employed as the electron injection material. An inorganic semiconductor such as n-Si and n-SiC may also be used as the electron transporting material similar to the hole transporting layer.

The electron transporting layer can be formed by making the electron transporting material to a thin layer by a known method such as a vacuum evaporation method, a spin coat method a casting method and a LB method. The thickness of the positive hole transporting layer is preferably approximately from 5 nm to 5 µm even though there is no specific limitation thereon.

The electron transporting layer may have a single layer structure containing one or more kinds of the electron transporting material or a multi-layered structure composed of plural layers having the same or different composition.

Preferable examples of preparation of the organic EL element are described below.

For example, the preparation of the EL element having the foregoing constitution of Anode/Positive hole transporting layer/Light emission layer/Electron transporting layer/Cathode is described. On a suitable substrate, a thin layer of a desired material for electrode such as an anode material is formed by an evaporation or spattering method so that the thickness of the layer is not more than 1 μm, preferably within the range of from 10 to 200 nm to prepare the anode. Then thin layers of a material of the positive hole transporting layer, a material of the light emission layer and a material of the electron transporting layer are formed on the anode.

The compounds of Formula (I) through (VI) according to the invention may be contained in any of the positive hole blocking layer, positive hole transporting layer, light emission layer, electron transporting layer and cathode buffer layer, anode buffer layer and the compound may form a layer singly or together with another compound.

For formation of the thin layer, a vacuum evaporation method is preferably used even though a spin coating method, a casting method and an evaporation method can be used. The vacuum evaporation method is preferable since a uniform layer can be formed and a pinhole is formed with difficulty when the layer formed by such the method. It is preferable to optionally select the conditions of the vacuum evaporation in the ranges of the boat heating temperature of from 50° C. to 450° C., the vacuum degree of from $10^{-6}$ to $10^{-3}$ Pa, the evaporation speed of from 0.01 to 50 nm/second, the substrate temperature of from −50° C. to 300° C., and the thickness of from 5 nm to 5 μm.

After formation of these layers, a thin layer comprising a material for cathode is formed thereon by, for example, an evaporation method or spattering method so that the thickness is not more than 1 μm, preferably from 50 to 200 nm, to provide the cathode. Thus a desired EL element is obtained. Though it is preferable that the preparation of the EL element is continuously carried out from the formation of the positive hole transporting layer to that of the cathode under one time of vacuuming, it is possible to prepare it such that the element is took out and is subjected to different coating process. In this instance the operation should be done in circumstances of dry inert gas.

The organic EL element can be prepared in the reverse order. Light emission can be observed when a direct current with a voltage of from about 5 to 40 V is applied to thus prepared organic EL element so that the polarity of the anode is positive and that of the cathode is negative. When the voltage is applied in the reverse polarity, no current is formed and light is not emitted at all. When an alternating current is applied, light is emitted only when the polarity of the node is positive and that of the cathode is negative. The shape of the wave of the alternating current may be optionally selected.

The organic EL element according to the invention having a color converter is described below. The color converter is a device containing a fluorescent dye which absorbs light emitted from the organic EL element and emits fluorescent light different in the wavelength from the light from the organic EL element. The organic EL element is become possible to display color other than the color emitted from the light emission layer by the use of the color converter not only the color emitted from the element.

The color converter is preferably a color conversion layer.

The fluorescent substance may be either an organic fluorescent substance or an inorganic fluorescent substance, which may be selected according to the expected conversion wavelength.

Examples of the organic fluorescent substance include coumarin dyes, pyran dyes, cyanine dyes, croconium dyes, squalium dyes, oxobenzanthracene dyes, fluorescein dyes, Rhodamine dyes, pyrylium dyes, perylene dyes, stilbene dyes and polythiophene dyes.

The inorganic fluorescent substance is preferably in a state of fine particles having a diameter of not more than 3 μm. It is more preferably that the inorganic fluorescent substance is in a form of approximate monodispersed ultra fine particles which is synthesized by way of a liquid phase method.

Examples of the inorganic fluorescent substance include an inorganic fluorescent substance comprising a mother crystal and an activator and a rare-earth complex fluorescent substance.

The composition of the inorganic fluorescent is preferably a combination of a metal oxide such as $Y_2O_2S$, $Zn_2SiO_4$ and $Ca_5(PO_4)_3Cl$ and a metal sulfide such as ZnS, SrS and CaS as the mother crystal; and an ion of rare-earth metal such as Ce, Pr, Nd, Pm, Sm, Eu, Gd, Tb, Dy, Ho, Er, Tm and Yb and an ion of metal such as Ag, Al, Mn, In, Cu and Sb as the activator, even though there is no limitation on the composition of the inorganic fluorescent substance.

In detail, the metal oxide is preferred as the mother crystal. Examples of typical mother crystal include aluminum oxide, silicon oxide, phosphate and halophosphate each substituted by an alkali-earth metal such as $(X)_3Al_{16}O_{27}$, $(X)_4Al_{14}O_{25}$, $(X)_3Al_2Si_2O_{10}$, $(X)_4Si_2O_8$, $(X)_2Si_2O_6$, $(X)_2P_2O_7$, $(X)_2P_2O_5$, $(X)_5(PO_4)_3Cl$ and $(X)_2Si_3O_8$–$2(X)Cl_2$, in which X is an alkali-earth metal, the alkali-earth may be one kind of metal or a mixture of two or more kinds of metal and the mixing ratio of the mixture may be optional.

Examples of preferable mother crystal other than the above include oxide and sulfide of zinc, oxide and oxide in which a part thereof is substituted by sulfide of a rare-earth metal such as yttrium, gadolinium and lanthanum of rare-earth metal, such the oxide and sulfide combined with an optional metal element.

Preferable examples of the mother crystal are shown below:

$Mg_4GeO_{5.5}F$, $Mg_4GeO_6$, ZnS, $Y_2O_2S$, $Y_3Al_5O_{12}$, $Y_2SiO_{10}$, $Zn_2SiO_4$, $Y_2O_3$, $BaNgAl_{10}O_{17}$, $BaAl_{12}O_{19}$, (Ba, Sr, Mg)O. $aAl_2O_3$, $(Y, Gd)BO_3$, (Zn, Cd)S, $SrGa_2S_4$, SrS, GaS, $SnO_2$, $Ca_{10}(PO_4)_6(F, Cl)_2$, (Ba, Sr) (Mg, Mn)$Al_{10}O_{17}$, (Sr, Ca, Ba, Mg)$_{10}(PO_4)_6Cl_2$, (La, Ce)$PO_4$, $CeMgAl_{11}O_{19}$, $GdMgB_5O_{10}$, $Sr_2P_2O_7$, $Sr_4Al_{14}O_{25}$, $Y_2SO_4$, $Gd_2O_2S$, $YVO_4$ and $Y(P, V)O_4$.

A part of the ions constituting the foregoing mother crystal, the activator or the coactivator may be replaced by another element of the same group. There is no limitation on the composition of the element, as long as the element absorbs light within the region of from blue to bluish purple and emits visible light.

In the invention, an ion of lanthanide element such as La, Eu, Tb, Ce, Yb and Pr and an ion of metal such as Ag, Mn, Cu, In, and Al are preferably used as the activator and the coactivator of the inorganic fluorescent substance. The doping amount of them is preferably from 0.001 to 100 mole-%, more preferably from 0.01 to 50 mole-%, of the mother crystal.

The activator or the coactivator is doped in the mother crystal by replacing a part of the ions constituting the mother crystal by an ion such as lanthanide ion.

Actual composition of the florescent crystal is exactly described as follows, however, the values of x, y and z are not described since the amount of the activator often does not influence on the essential properties of the fluorescent substance. For example, $Sr_{4-x}Al_{14}O_{25}$:$Eu_{2+x}$ is described as $Sr_4Al_{14}O_{25}$:$Eu_{2+}$ in the invention.

Compositions of typical inorganic fluorescent substances each comprising the mother crystal and the activator are shown below. However, the invention is not limited thereto:

$(Ba_zMg_{1-z})_{3-x-y}Al_{16}O_{27}:Eu_{2+x}.Mn_{2+y}$, $Sr_{4-x}Al_{14}O_{25}:EU_{2+x}$, $(Sr_{1-z}Ba_z)_{1-x}Al_{12}Si_2O_8:Eu_{2+x}$, $Ba_{2-x}SiO_4:Eu_{2+x}$, $Sr_{2-x}SiO_4:Eu_{2+x}$, $Mg_{2-x}SiO_4:Eu_{2+x}$, $(BaSr)_{1-x}SiO_4:Eu_{2+x}$, $Y_{2-x-y}SiO_5:Ce_{3+x}.Tb_{3+y}$, $Sr_{2-x}P_2O_5: Eu_{2+x}$, $Sr_{2-x}P_2O_7:Eu_{2+x}$, $(Ba_yCa_zMg_{1-y-z})_{5-x}(PO_4)_3Cl:Eu_{2+x}$ and $Sr_{2-x}Si_3O_8–2SrCl_2:Eu_{2+x}$, in which x, y and z are each an optional number of not more than 1.

Examples of the inorganic fluorescent substance to be preferably used are shown below.

| Blue light emitting inorganic fluorescent substance | |
|---|---|
| (BL-1) | $Sr_2P_2O_7:Sn_{4+}$ |
| (BL-2) | $Sr_4Al_{14}O_{25}:Eu_{2+}$ |
| (BL-3) | $BaMgAl_{10}O_{17}:Eu_{2+}$ |
| (BL-4) | $SrGa_2S_4:Ce_{3+}$ |
| (BL-5) | $CaGa_2S_4:Ce_{3+}$ |
| (BL-6) | $(Ba, Sr)(Mg, Mn)Al_{10}O_{17}:Eu_{2+}$ |
| (BL-7) | $(Sr, Ca, Ba, Mg)_{10}(PO_4)_6Cl_2:Eu_{2+}$ |
| (BL-8) | $BaAl_2SiO_8:Eu_{2+}$ |
| (BL-9) | $Sr_2P_2O_7:Eu_{2+}$ |
| (BL-10) | $Sr_5(PO_4)_3Cl:Eu_{2+}$ |
| (BL-11) | $(Sr, Ca, Ba)_5(PO_4)_3Cl:Eu_{2+}$ |
| (BL-12) | $BaMg_2Al_{16}O_{27}:Eu_{2+}$ |
| (BL-13) | $(Ba, Ca)_5(PO_4)_3Cl:Eu_{2+}$ |
| (BL-14) | $Ba_3MgSi_2O_8:Eu_{2+}$ |
| (BL-15) | $Sr_3MgSi_2O_8:Eu_{2+}$ |
| Green light emitting inorganic fluorescent substance | |
| (GL-1) | $(BaMg)Al_{16}O_{27}:Eu_{2+}, Mn_{2+}$ |
| (GL-2) | $Sr_4Al_{14}O_{25}:Eu_{2+}$ |
| (GL-3) | $(SrBa)Al_2Si_2O_8:Eu_{2+}$ |
| (GL-4) | $(BaMg)_2SiO_4:Eu_{2+}$ |
| (GL-5) | $Y_2SiO_5:Ce_{3+}, Tb_{3+}$ |
| (GL-6) | $Sr_2P_2O_7–Sr_2B_2O_5:Eu_{2+}$ |
| (GL-7) | $(BaCaMg)_5(PO_4)_3Cl:Eu_{2+}$ |
| (GL-8) | $Sr_2Si_3O_8—2SrCl_2:Eu_{2+}$ |
| (GL-9) | $Zr_2SiO_4, MgAl_{11}O_{19}:Ce_{3+}, Tb_{3+}$ |
| (GL-10) | $Ba_2SiO_4:Eu_{2+}$ |
| (GL-11) | $Sr_2SiO_4:Eu_{2+}$ |
| (GL-12) | $(BaSr)SiO_4:Eu_{2+}$ |
| Red light emitting inorganic fluorescent substance | |
| (RL-1) | $Y_2O_2S:Eu_{3+}$ |
| (RL-2) | $YAlO_3:Eu_{3+}$ |
| (RL-3) | $Ca_2Y_2(SiO_4)_6:Eu_{3+}$ |
| (RL-4) | $LiY_9(SiO_4)_6O_2:Eu_{3+}$ |
| (RL-5) | $YVO_4:Eu_{3+}$ |
| (RL-6) | $CaS:Eu_{3+}$ |
| (RL-7) | $Gd_2O_3:Eu_{3+}$ |
| (RL-8) | $Gd_2O_2S:Eu_{3+}$ |
| (RL-9) | $Y(P, V)O_4:Eu_{3+}$ |
| (RL-10) | $Mg_4GeO_{5.5}F:Mn_{4+}$ |
| (RL-11) | $Mg_4GeO_6:Mn_{4+}$ |
| (RL-12) | $K_5Eu_{2.5}(WO_4)_{6.25}$ |
| (RL-13) | $Na_5Eu_{2.5}(WO_4)_{6.25}$ |
| (RL-14) | $K_5Eu_{2.5}(MoO_4)_{6.25}$ |
| (RL-15) | $Na_5Eu_{2.5}(MoO_4)_{6.25}$ |

The foregoing inorganic fluorescent substances may be subjected to a surface improving treatment according to necessity. The treatment can be performed by a chemical treatment using a silane coupling agent, by physical treatment by addition of fine particles having a diameter of submicron and a combination of such the treatments.

Examples of the rare-earth metal complex include complexes containing Ce, Pr, Nd, Pm, Eu, Gd, Tb, Dy, Ho, Er or Yb as the rare metal. The organic ligand composing the complex may be either an aromatic one or a non-aromatic one. A compound represented by the following formula B is preferable.

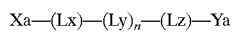

Xa—(Lx)—(Ly)$_n$—(Lz)—Ya    Formula B

In the above formula, Lx, Ly and Lz are each an atom having two or more bonding hands, n is 0 or 1, Xa is a substituent having an atom capable of coordinating at the position adjacent to Lz. An optional portion of Xa may be condensed with Lx to form a ring, an optional portion of Ya may be condensed with Lz to form a ring, and at least one aromatic hydrocarbon ring or aromatic heterocyclic ring exists in the molecule, provided that the aromatic hydrocarbon ring or the aromatic heterocyclic ring may not exist when Xa—(Lx)—(Ly)$_n$—(Lz)—Ya is a β-diketone derivative, a β-ketoester derivative, a β-ketoamide derivatives one formed by replacing the oxygen atom of the foregoing ketone by sulfur atom or an —$NR_{201}$ group, a crown ether, a thia crown ether, or a crown ether in which optional number of oxygen atoms are replaced by sulfur atoms or —$NR_{201}$ groups. In the —$NR_{201}$ group, $R_{201}$ is a hydrogen atom, a substituted or unsubstituted alkyl group or a substituted or unsubstituted aryl group.

In Formula B, the coordinatable atom represented by Xa and Ya is concretely an oxygen atom, a nitrogen atom, a sulfur atom, a selenium atom or a tellurium atom. Among them, an oxygen atom, a nitrogen atom and sulfur atom are particularly preferable.

In Formula B, the atom having two or more bonding hands represented by Lx, Ly or Lz is typically a carbon atom, an oxygen atom, a nitrogen atom, a silicon atom and a titanium atom even though there is no limitation. The carbon atom is particularly preferable among them.

Concrete examples of the rare-earth metal complex fluorescent substance are shown below.

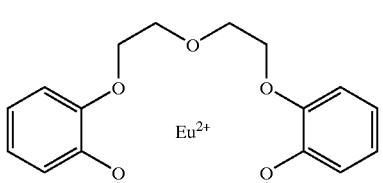

RE-1

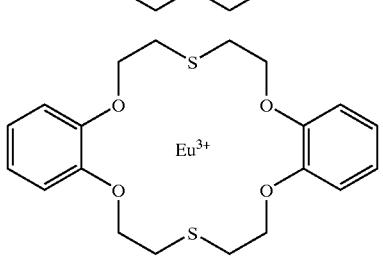

RE-2

-continued
RE-3
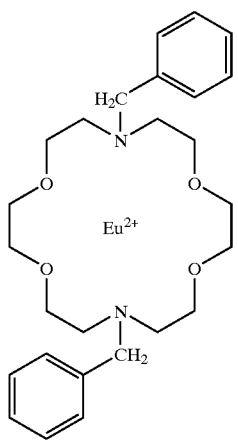
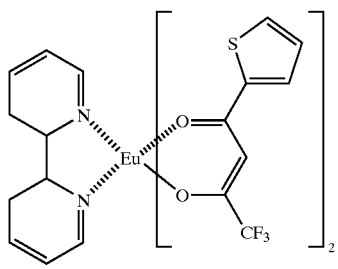
RE-4
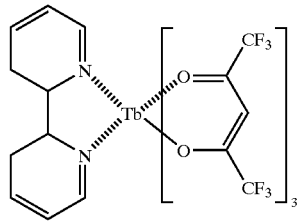
RE-5
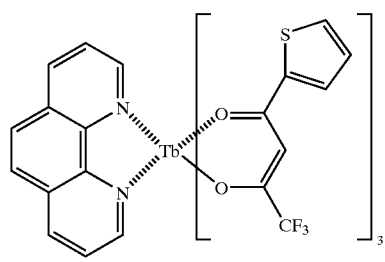
RE-6
RE-7
-continued
RE-8
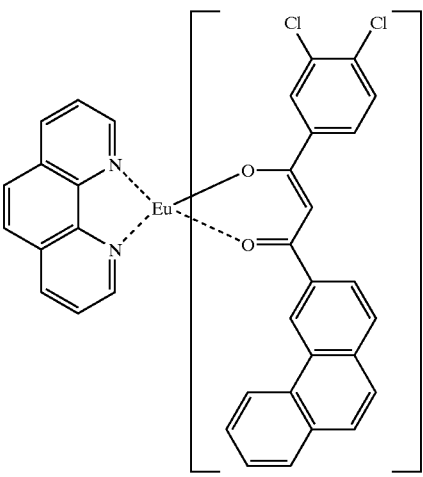
RE-9
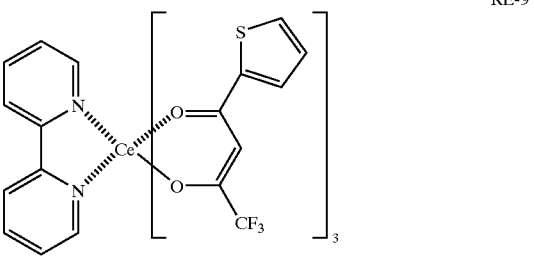
RE-10
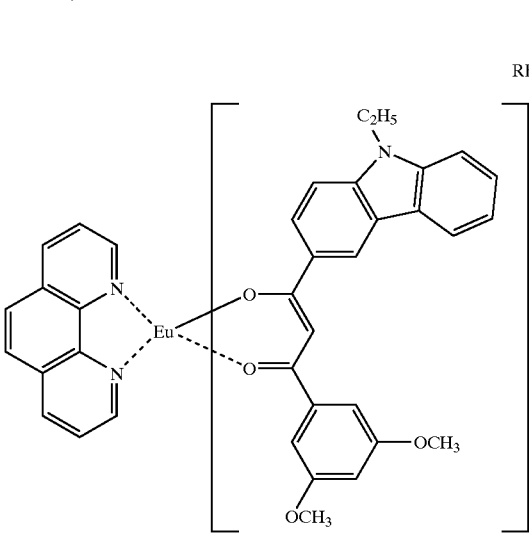
RE-11
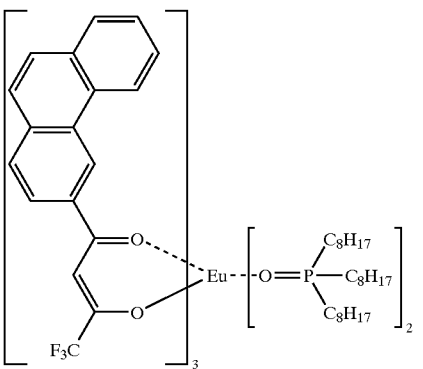

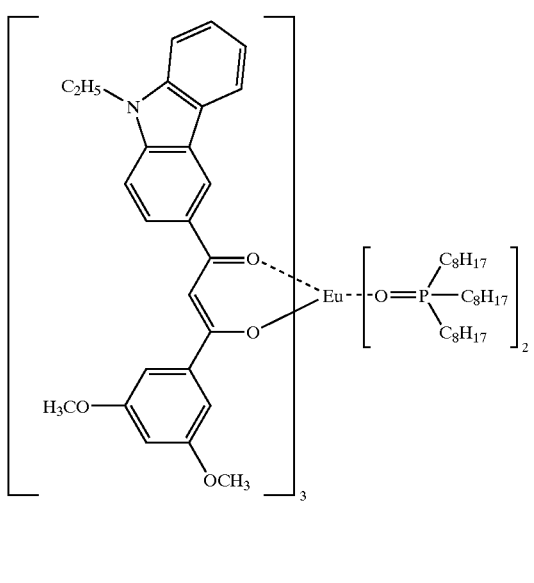

RE-12

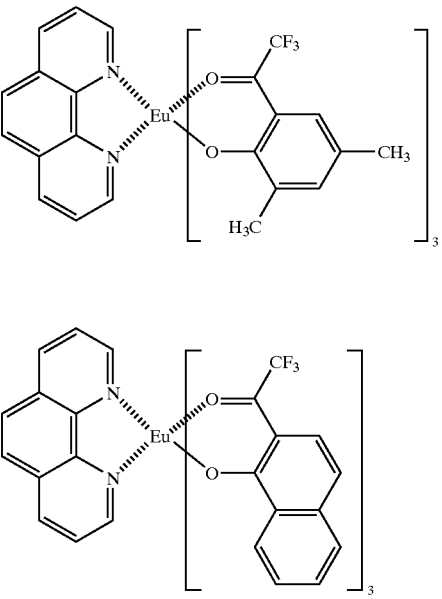

RE-15

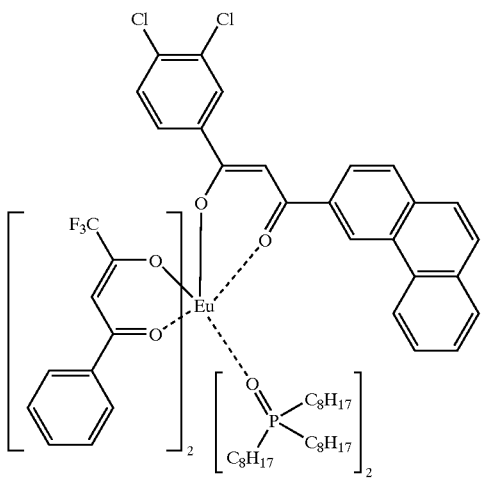

RE-13

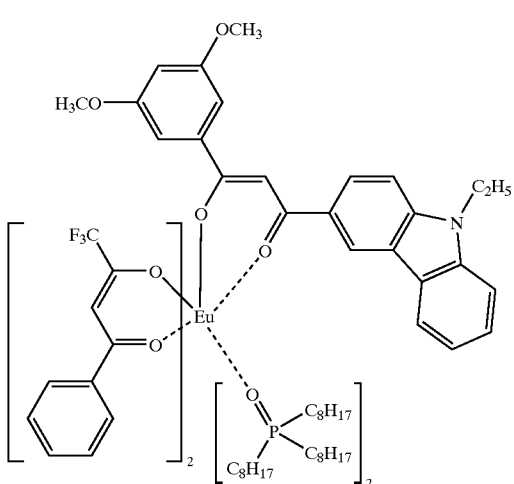

RE-14

RE-16

RE-17

The color converter is preferably provided between the transparent electrode and the transparent substrate, or at the side opposite to the transparent electrode on the transparent substrate, even though there is no limitation on the position of the color converter as long as the color conversion means can absorb light emitted from the organic El portion having an optical resonance fine structure.

The color converter may be a layer prepared by evaporating or spattering the fluorescent substance or a coated layer prepared by coating a dispersion containing a binder resin and the fluorescent substance dispersed in the resin. The thickness of the layer is suitably within the range of from 10 nm to 5 mm. When the fluorescent substance is dispersed in the resin of the coated layer, the concentration of the fluorescent substance may be within the range in which quenching of the fluorescent light is not occurred and the light come from the organic EL portion is sufficiently absorbed. A concentration of from $10^{-7}$ moles to $10^{-3}$ moles per gram of the resin is suitable but the concentration may be varied depending on the kind of the fluorescent substance. In the case of the inorganic fluorescent substance, the fluorescent substance can be used approximately from 0.1 g to 10 g per gram of the resin since the quenching is negligible.

In the organic EL element according to the invention, the element may be sealed by adhering a sealing member, the electrode and the transparent substrate by an adhesive agent.

The sealing member is positioned so as to cover the displaying area of the organic EL element and the shape thereof may be either concave or flat. The transparency and the electro resistively of the sealing member are not specifically limited.

Concretely, a glass plate, a polymer plate and a metal plate are usable. Examples of the glass plate include a plate of soda ash glass, barium-strontium-containing glass, lead glass, aluminosilicate glass, borosilicate glass, barium-borosilicate glass and quartz glass. Examples of the polymer plate include a plate of polycarbonate, polyacryl, poly (ethylene terephthalate), poly(ether sulfide) and polysulfone. Examples of the metal plate include a plate of a metal or an alloy selected from stainless steel, iron, copper, aluminum, magnesium, nickel, zinc, titanium, molybdenum, silicon, germanium and tantalum. For making the sealing member to concave shape, a sand blasting and chemical etching treatment are applicable.

As the adhesive agent, a photo-hardenable and a thermo-hardenable type adhesive agent having a reactive vinyl group such as an acrylic acid oligomer, a methacrylic acid oligomer, and a moisture-hardenable adhesive agent such as a 2-cyanoacrylate are usable. A thermal or chemical hardenable adhesive agent (tow liquids mixture type) such as an epoxy type adhesive agent is also usable. A hot-melt type adhesive agent such as polyamide, polyester and polyolefin is also usable. Moreover, a cation hardenable adhesive agent such as an epoxy resin adhesive agent hardened by UV rays is usable. It is preferable that the adhesive agent is one capable of being hardened or adhered at a temperature within the range of from room temperature to 80° C. since the organic EL element tends to be degraded by the heating treatment. A drying agent may be dispersed in the adhesive agent.

The adhesive agent may be coated by a dispenser available in the market or printed by a silk screen printing to the sealing portion.

It is preferable to inject an inactive gas such as nitrogen and argon or an inactive liquid such as fluorized hydrocarbon into the space between the sealing member and the display area of the organic EL element. The space may be made vacuum. A hygroscopic substance may be sealed in the space.

Examples of the hygroscopic substance include a metal oxide such as sodium oxide, potassium oxide, calcium oxide, barium oxide and magnesium oxide, a sulfate such as sodium sulfate, calcium sulfate, magnesium sulfate and cobalt sulfate, a metal halide such as calcium chloride, magnesium chloride, cesium fluoride, tantalum fluoride, cerium bromide, magnesium bromide, barium iodide and magnesium bromide and a perchlorate such as barium perchlorate and magnesium perchlorate. In the case of the sulfate, metal halide and perchlorate, anhydrate of those compounds are preferably used.

The organic EL element according to the invention may have a color conversion layer or a color conversion filter each containing a fluorescent substance at the interior or the exterior of the element.

The organic EL element according to the invention may be used as a kind of lump such as a light source for illumination and photographic exposure, or may be used as a display device for reproducing a still or moving image. When the element is used as the display device for reproducing a moving image, the driving means may be either a passive matrix drive or an active matrix drive.

EXAMPLES

The invention is concretely described below according to examples, but the embodiment of the invention is not limited thereto.

Example 1

Synthesis of Exemplified Compound 3 of the Invention

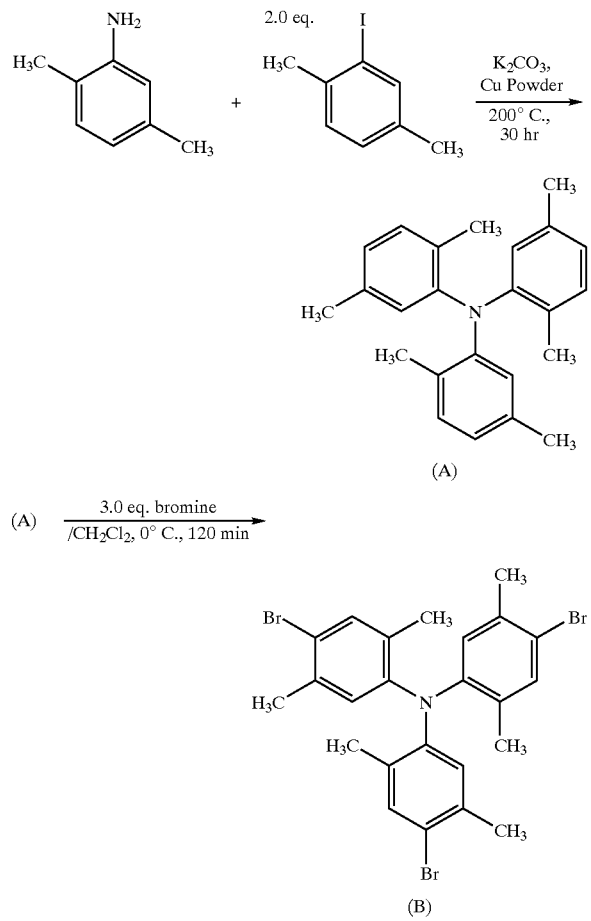

-continued

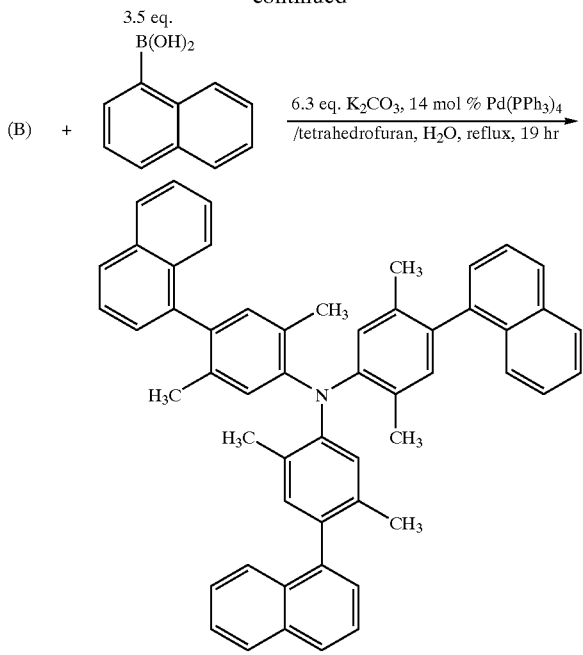

Compound 3

A mixture of 2.37 g of 2,5-dimethylaniline, 10 g of 2.5-dimethyliodobenzene, 1.25 g of copper powder and 2.98 g of potassium carbonate was heated at 200° C. for 30 hours while stirring. Then tetrahydrofuran, ethyl acetate and water were added to the reacting liquid and filtered by cerite to remove the aqueous layer. The remained organic layer was washed by a saturated sodium chloride solution and dried by magnesium sulfate. Thereafter, the product was concentrated, purified by a column and recrystallized using ethyl acetate. Thus 5 g of triphenylamine (A) was obtained. To 25 ml of methylene chloride, 2.0 g of (A) was added and 2.9 g bromine was dropped into the solution at 0° C. After stirring for 1 hour, the product was concentrated and purified. Thus 2.7 g of tris(4-bromo-2,5-dimethylphenyl)amine (B) was obtained. Then 1.00 g of (B) was reacted with 1.00 g of naphthylboric acid in a two-layer solvent system of 50 ml of tetrahydrofuran and 5 ml of water in the presence of potassium carbonate and a palladium catalyst to obtain 690 mg of Compound 3 of the invention. It was confirmed by NMR and mass-spectrum that the product was the object substance.

Physical data of Compound 3 of the invention: Melting point: 305–310° C. $^1$H-NMR (400 MHz, CDCl$_3$) δ/ppml. 96 (s, 9H), 2.05 (s, 9H), 6.90 (s, 3H), 7.09 (s, 3H), 7.40 (t, J=6.8 Hz, 3H), 7.41 (t, J=6.8 Hz, 3H) 7.47 (t, J=6.8 Hz, 3H), 7.52 (t, J=8.1 Hz, 3H), 7.54 (m, 3H), 7.84 (d, J=8.1 Hz, 3H), 7.89 (d, J=8.1 Hz, 3H) MS (FAB) m/z 707 (M$^+$)

Figure 1:
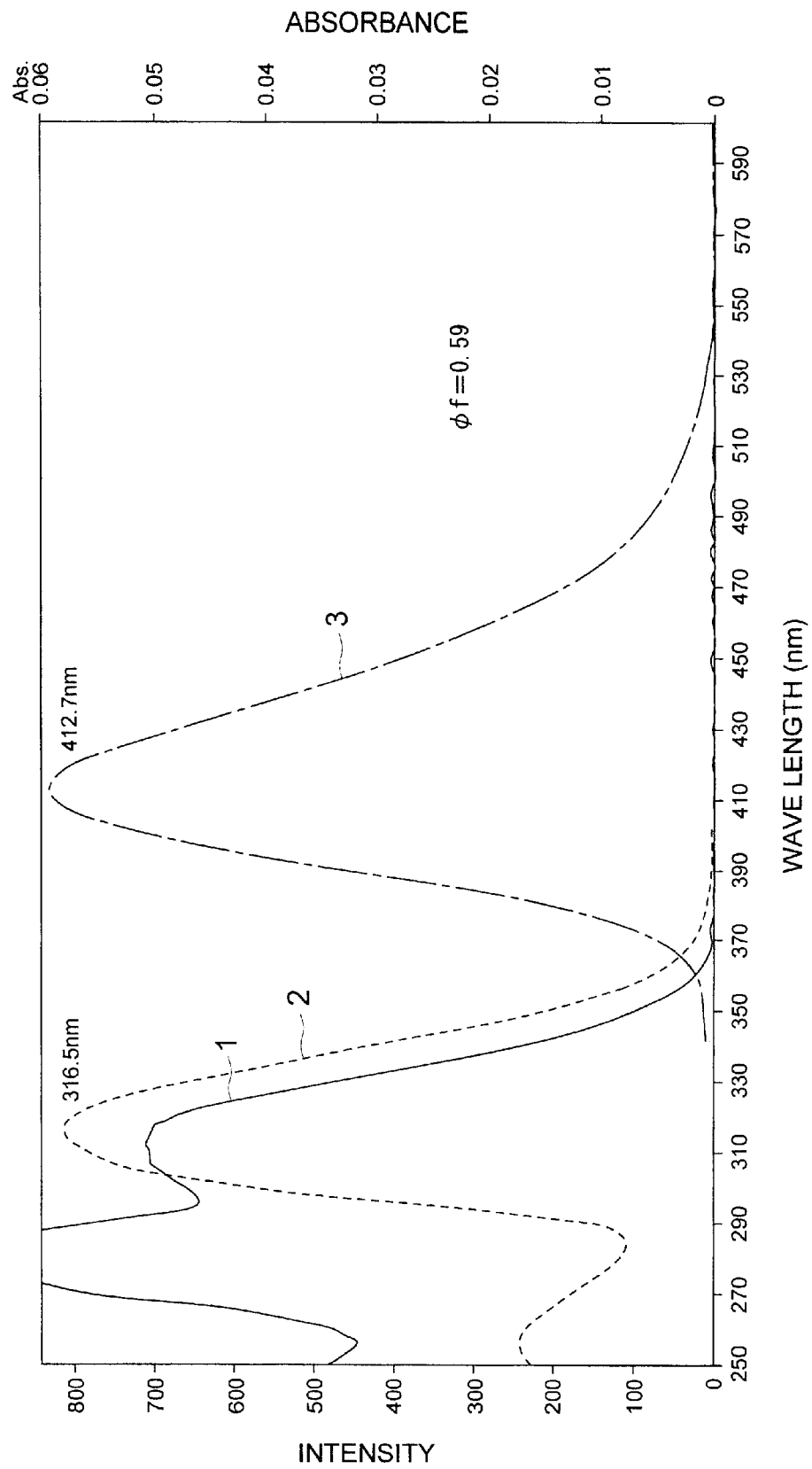
FIG. 1 is a chart showing the spectral absorbance, spectrum of fluorescent light and the spectrum of excitation of Exemplified Compound 3 of the invention.
Figure 2:
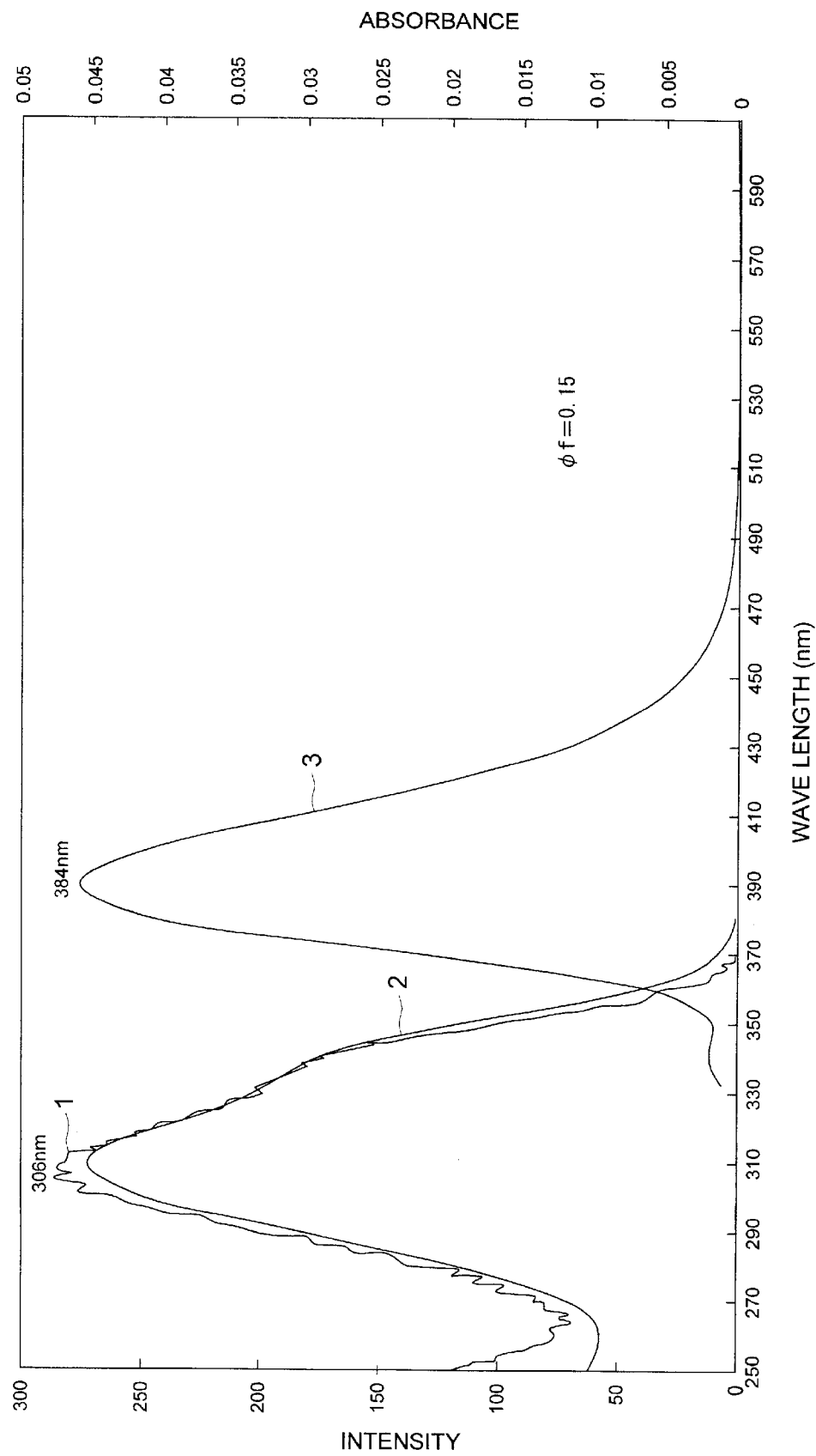
FIG. 2 is a chart showing the spectral absorbance, spectrum of fluorescent light and the spectrum of excitation of Exemplified Compound 57 of the invention.

The charts of absorbance, fluorescent and exciting spectrum of Compound 3 of the invention measured in tetrahydrofuran are shown in FIG. 1. The fluorescent quantum efficiency was 0.59.

Example 2-1

Preparation of Comparative Organic EL Element OLED-01

A pattern was formed on a substrate, manufactured by NH Technoglass Co., Ltd., composed of a glass plate and a layer of ITO of 150 nm as an anode formed on the glass plate. Then the transparent substrate having the ITO transparent electrode was subjected to ultrasonic washing in i-propyl alcohol and dried by dried nitrogen gas and subjected to UV-ozone cleaning for 5 minutes. Thus obtained transparent substrate was fixed on a substrate holder of a vacuum evaporation apparatus available in the market. Besides, 200 mg of Compound H-1 was put into a resistive heating boat of molybdenum and 200 mg of aluminum tris(8-hydroxyquinolynate) (Alq3) was put into another resistive heating boat. The both boats were set in the vacuum evaporation apparatus.

Then the pressure in the vacuum tank was reduced by $4\times10^{-4}$ Pa, and the boat carrying Compound H-1 was heated by 220° C. by applying an electric current to the boat so as to form a positive hole charge transportation layer having a thickness of 60 nm by evaporating Compound H-1 onto the transparent substrate at a evaporating speed of from 0.1 to 0.3 nm/sec. Moreover, the boat carrying Alq3 was heated by 220° C. by applying an electric current to the boat so as to evaporate a light emission layer of 40 nm onto the positive hole charge transportation layer at a evaporating speed of from 0.1 to 0.3 nm/sec. The temperature of the substrate at the time of the evaporation was an ordinary temperature.

Next, the vacuum tank was opened, and a stainless steel mask having a rectangular hole was set on the light emission layer. Besides, 3 g of magnesium was put in a molybdenum resistive heating boat and 0.5 g of silver was put in a tungsten basket for evaporation. The boat and the basket were set in the vacuum tank. The pressure in the vacuum tank was reduced by $2\times10^{-4}$ Pa. Then the boat carrying magnesium was heated by applying an electric current so as to evaporate magnesium at an evaporation speed of from 1.5 to 2.0 nm/sec. At this time, the basket carrying silver was simultaneously heated so as to evaporate silver at an evaporation speed of 0.1 nm/sec to form a counter electrode composed of a mixture of magnesium and silver. Thus a comparative organic EL element OLED-01 shown in Table 2 was prepared.

Example 2-2

Preparation of Comparative Organic Elements OLED-02 to OLED-04 and Organic EL Element According to the Invention OLED-05 to OLED-17

(Evaluation as the Positive Hole Charge Transportation Material)

Organic EL elements OLED-02 to OLED-17 were prepared in the same manner as in OLED-01 prepared in Example 2-1 except that Compound H-1 used in OLED-01 as the positive hole charge transportation material was replaced by the compounds shown in Table 2.

Each of the organic El elements was continuously lighted by applying a direct current of 15V between the ITO electrode as an anode and the counter electrode composed of magnesium and silver at 23° C. in an atmosphere of dried nitrogen gas. The brightness of the emitted light (cd/m$^2$) at the start of lighting and the half-value period of the brightness were measured. The brightness was expressed by a relative value when the brightness of OLED-01 was set at 100 and the half-value period of brightness was expressed by a relative value when the half-value period of brightness of OLED-01 was set at 100.

TABLE 2

| No. | The first layer Positive hole charge transportation material | Brightness of emitted light (Relative value) | Color of emitted light | Half-value period of brightness (Relative value) | Remarks |
|---|---|---|---|---|---|
| OLED-01 | H-1 | 100 | Green | 100 | Comp. |
| OLED-02 | H-2 | 120 | Green | 208 | Comp. |
| OLED-03 | H-3 | 115 | Green | 183 | Comp. |
| OLED-04 | H-4 | 101 | Green | 122 | Comp. |
| OLED-05 | (2) | 139 | Green | 331 | Inv. |
| OLED-06 | (11) | 152 | Green | 358 | Inv. |
| OLED-07 | (16) | 163 | Green | 362 | Inv. |
| OLED-08 | (18) | 148 | Green | 326 | Inv. |
| OLED-09 | (19) | 156 | Green | 401 | Inv. |
| OLED-10 | (25) | 150 | Green | 403 | Inv. |
| OLED-11 | (31) | 147 | Green | 382 | Inv. |
| OLED-12 | (36) | 160 | Green | 397 | Inv. |
| OLED-13 | (38) | 165 | Green | 423 | Inv. |
| OLED-14 | (42) | 163 | Green | 438 | Inv. |
| OLED-15 | (57) | 166 | Green | 450 | Inv. |
| OLED-16 | (59) | 158 | Green | 472 | Inv. |
| OLED-17 | (62) | 152 | Green | 491 | Inv. |

Comp.; Comparative, Inv.; Inventive

It is understood from table 2 that the samples OLED-05 t0 OLED-17 each using the compound according to the invention as the positive hole charge transportation material of the organic EL element each has a high emission light brightness and a long life of the organic EL element.

Example 2-3

Preparation of Comparative Organic Elements OLED-18 to OLED-20 and Organic EL Element According to the Invention OLED-21 to OLED-32

(Evaluation as the Light Emission Material)

Organic EL elements OLED-18 to OLED-32 were prepared by changing H-1 in the first layer of the organic EL element to copper phthalocyanine and the thickness of the layer to 10 nm, and changing Alq3 used in the light emitting material in the second layer to compound shown in table 3 and the layer thickness to 60 nm.

The structures of the compounds used in Examples 2-1 to 2-3 are shown below.

Compound H-1

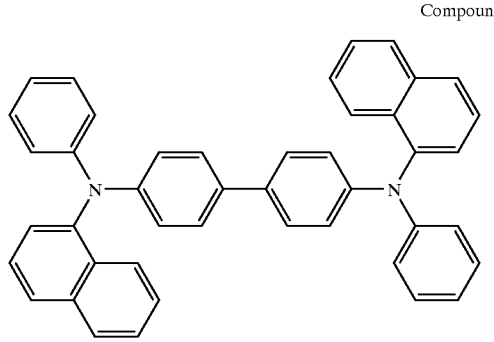

Alq3

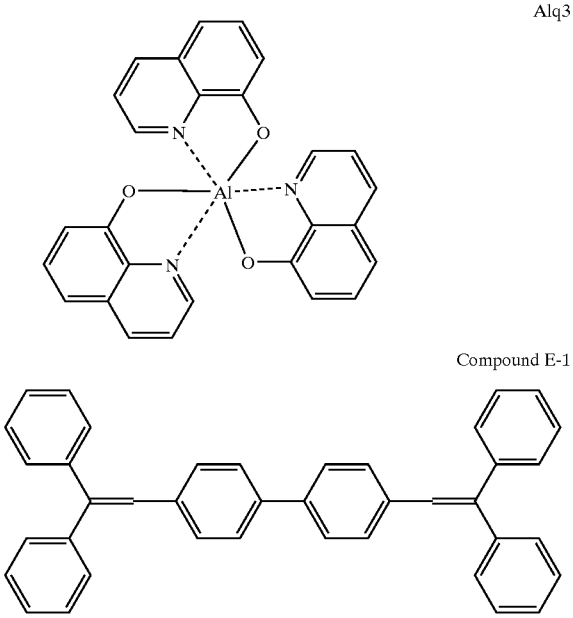

Compound E-1

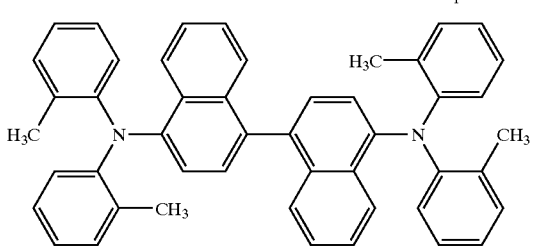

Compound H-2

Compound H-3

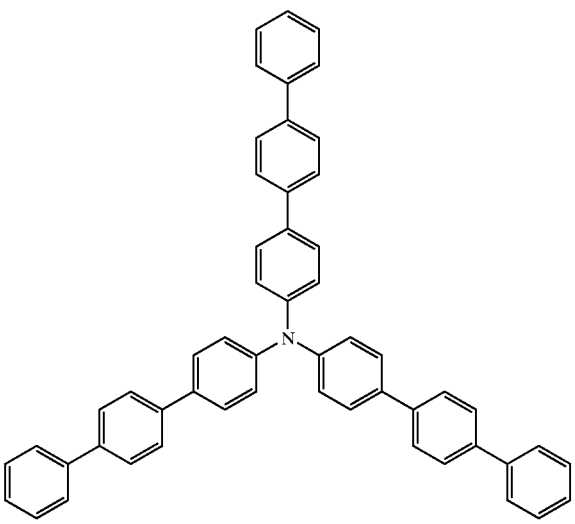

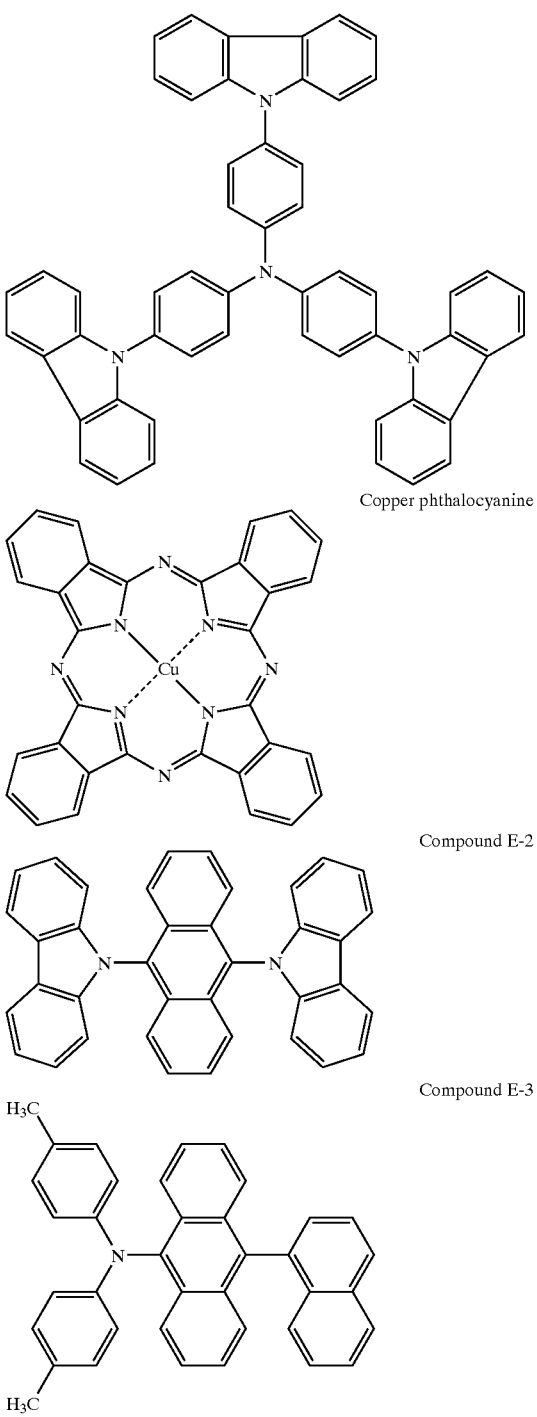

Compound H-4

Copper phthalocyanine

Compound E-2

Compound E-3

Each of the organic EL elements was continuously lighted by applying a direct current of 15V between the ITO electrode as an anode and the counter electrode composed of magnesium and silver at 23° C. in an atmosphere of dried nitrogen gas. The brightness of the emitted light (cd/m$^2$) at the start of lighting and the half-value period of the brightness were measured. The brightness was expressed by a relative value when the brightness of OLED-18 was set at 100 and the half-value period of brightness was expressed by a relative value when the half-value period of brightness of OLED-18 was set at 100. Results are shown in Table 3.

TABLE 3

| No. | The second layer Light emission layer | Brightness of emitted light (Relative value) | Color of emitted light | Half-value period of brightness (Relative value) | Remarks |
|---|---|---|---|---|---|
| OLED-18 | E-1 | 100 | Blue green | 100 | Comp. |
| OLED-19 | E-2 | 98 | Blue | 88 | Comp. |
| OLED-20 | E-3 | 102 | Blue | 92 | Comp. |
| OLED-21 | (3) | 182 | Bluish purple | 169 | Inv. |
| OLED-22 | (6) | 190 | Bluish purple | 208 | Inv. |
| OLED-23 | (10) | 188 | Bluish purple | 175 | Inv. |
| OLED-24 | (12) | 222 | Bluish purple | 210 | Inv. |
| OLED-25 | (19) | 201 | Bluish purple | 168 | Inv. |
| OLED-26 | (23) | 235 | Bluish purple | 172 | Inv. |
| OLED-27 | (27) | 228 | Bluish purple | 203 | Inv. |
| OLED-28 | (38) | 250 | Blue | 225 | Inv. |
| OLED-29 | (39) | 246 | Blue | 231 | Inv. |
| OLED-30 | (42) | 253 | Blue | 228 | Inv. |
| OLED-31 | (7) | 295 | Bluish purple | 315 | Inv. |
| OLED-32 | (49) | 273 | Bluish purple | 301 | Inv. |

Comp.; Comparative, Inv.; Inventive

It is understood from table 3 that the samples OLED-21 to OLED-32 each using the compound according to the invention as the light emission layer each emits light within the range of from blue to bluish purple and has a high emission light brightness and a long life of the organic EL element.

Example 3

Synthesis of Compound 57

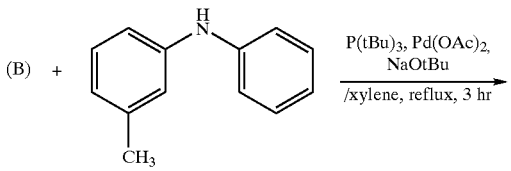

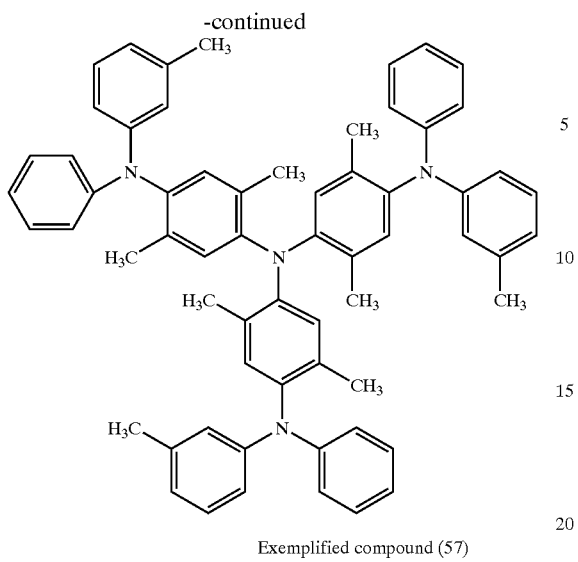

Exemplified compound (57)

In a nitrogen atmosphere, 80 mg of palladium acetate and 300 mg of tert-butylphosphine were added to 25 ml of dehydrated xylene. Then 2.3 g of tris(4-bromo-2,5-dimethylphenyl)amine (B) synthesized in Example 1 and 1.4 g of sodium tert-butoxide were added and refluxed for 4 hours. Thereafter, the product was subjected to treatments for extraction, drying, purifying by column chromatography and recrystallization. Thus 800 mg of objective compound 57 was obtained with a yield of 23%.

Data of Compound 57: Melting point: 253–255° C. MS (FAB) m/z 872 (M$^+$)

The charts of absorbance, fluorescent and exciting spectrum of Compound 57 are shown in FIG. The quantum efficiency of fluorescent was 0.15.

Example 4

Preparation of Comparative Organic Elements OLED-101 to OLED-102 and Organic EL Element According to the Invention OLED-103 to OLED-108

On a transparent substrate on which an ITO transparent electrode the same as that in Example 2-1, m-MTDATA was evaporated so as to form a positive hole charge transportation layer having a thickness of 30 nm. On the hole charge transportation layer, E-1 was evaporated in the thickness of 40 nm to form a light emission layer. On the light emission layer, BC was evaporated in a thickness of 30 nm to form an electron transportation layer. Furthermore, aluminum was evaporated in a thickness of 100 nm to form a counter electrode. Thus, comparative organic EL element OLED-101 was prepared.

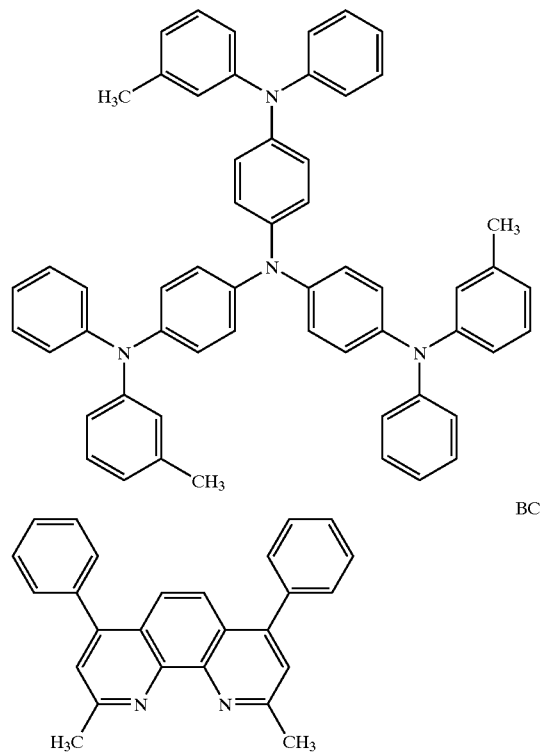

Comparative organic El element OLED-102 was prepared in the same manner as in OLED-101 except that a cathode buffer layer was provided by evaporating lithium fluoride in a thickness of 0.5 nm between the electron transportation layer and the aluminum layer.

Besides, organic EL elements OLED-103 through OLED-108 were prepared in the same manner as in OLED-101 except that the positive hole charge transportation layer, light emission layer, electron transportation layer and cathode buffer layer were changed as shown in Table 4.

Each of the organic EL elements was continuously lighted by applying a direct current of 10 V between the ITO electrode as an anode and the counter electrode composed of magnesium and silver at 23° C. in an atmosphere of dried nitrogen gas. The brightness of the emitted light (cd/m$^2$) at the start of lighting and the half-value period of the brightness were measured. The brightness was expressed by a relative value when the brightness of OLED-101 was set at 100 and the half-value period of brightness was expressed by a relative value when the half-value period of brightness of OLED-101 was set at 100. Results are shown in Table 4.

TABLE 4

| No. | The first layer Positive hole transportation layer | The second layer Light emission layer | The third layer Electron transportation layer | The fourth layer Cathode buffer layer | Brightness of emitted light (Relative value) | Color of emitted light | Half-value period of brightness (Relative value) | Remarks |
|---|---|---|---|---|---|---|---|---|
| OLED-101 | m-MTDATA | E-1 | BC | — | 100 | Blue | 100 | Comp. |
| OLED-102 | m-MTDATA | E-1 | BC | LiF | 132 | Blue | 121 | Comp. |
| OLED-103 | m-MTDATA | (7) | BC | — | 140 | Bluish purple | 128 | Inv. |

TABLE 4-continued

| No. | The first layer Positive hole transportation layer | The second layer Light emission layer | The third layer Electron transportation layer | The fourth layer Cathode buffer layer | Brightness of emitted light (Relative value) | Color of emitted light | Half-value period of brightness (Relative value) | Remarks |
|---|---|---|---|---|---|---|---|---|
| OLED-104 | (59) | E-1 | BC | — | 161 | Blue | 120 | Inv. |
| OLED-105 | m-MTDATA | (7) | BC | LiF | 245 | Bluish purple | 270 | Inv. |
| OLED-106 | (59) | E-1 | BC | LiF | 267 | Blue | 210 | Inv. |
| OLED-107 | (57) | (7) | BC | — | 250 | Bluish purple | 281 | Inv. |
| OLED-108 | (57) | (7) | BC | LiF | 410 | Bluish purple | 378 | Inv. |

Comp.; Comparative, Inv.; Inventive

These results show the followings.

1) The compound according to the invention is also effective when the compound used in an organic element having three-layer organic substance structure.
2) The compound according to the invention is more effective when the cathode buffer layer is provided compared with the case in which a usual compound is layered with a lithium fluoride layer.
3) The compound according to the invention is further effective when the compound is used in the positive hole charge transportation layer and the light emission layer.
4) The effects of the compound according to the invention are further raised when the compound is used in the positive hole charge transportation layer and the light emission layer and the cathode buffer layer is further layered.
5) An organic EL element capable of emitting light within the range of from blue to bluish purple and excellent in the light brightness and the life is obtained.

Example 5

Preparation of Color Conversion Filter Using Inorganic Fluorescent Substance

To 1.6 g of Aerosil having an average diameter of 5 nm, 15 g of ethanol and 0.22 g of γ-glycidoxypropyltriethoxysilane were added and stirred for 1 hour under open air. The mixture and 20 g of RL-12 were put into a mortar and sufficiently ground. Then the mixture is heated at 70° C. for 2 hours and further heated at 120° C. for 2 hours in an oven. Thus surface modified RL-12 was obtained.

LG-10 and BL-3 were also modified on the surface in the same manner as in RL-12.

To 10 g of the surface modified RL-12, 30 g of butyral resin BX-1 dissolved in 300 g of a mixture of toluene and ethanol in a ratio of 1:1 was added and stirred. Thus obtained liquid was coated in a wet thickness of 200 μm on a glass plate. The coated glass plate was dried by heating for 4 hours at 100° C. in an oven to prepare red conversion filter F-1 to be used as a color converter according to the invention.

Green conversions filter F-2 on which GL-10 was coated and blue conversion filter F-3 on which BL-3 was coated, were prepared in the same manner as in F-1.

Preparation of Organic EL Element Having the Color Conversion Filter as the Color Converter Thereafter, the blue conversion filter F-3 was pasted in a shape of stripe to the under side of OLED-108 prepared in Example 4. The organic EL element of this example had the following constitution.

Color converter/Substrate/Transparent electrode (ITO)/Organic compound thin layer/LiF thin layer/Metal electrode Blue light was emitted when an electric current of 10V was applied to the element. The wavelength of the maximum emission of the light was 448 nm and the position of the color on the CIE chromaticity diagram was (0.15, 0.06).

Moreover, organic EL elements were prepared in the same manner as in the element having the blue conversion filter F-3 except that in each of which the color conversion filter was replace by the green conversion filter F-2 and red conversion filter F-1, respectively. Green light having the maximum emission wavelength of 532 nm and the position of the color on the CIE chromaticity diagram of (0.24, 0.63) was emitted from the element having the green conversion filter F-2, and red light having the maximum emission wavelength of 615 nm and the position of the color on the CIE chromaticity diagram of (0.63, 0.33) was emitted from the element having the red conversion filter F-1.

An organic EL element the same as the above-mentioned except that the position of the color converter was charged to the upper side of the transparent substrate as the structure of the element was as follows.

Transparent substrate/Color converter/Transparent electrode (ITO)/Organic compound thin layer/LiF thin layer/Metal electrode In this case, blue, green and red light each having the maximum emission wavelength and the position on the CIE chromaticity diagram almost the same as each of the light from the foregoing elements, respectively. The brightness of the blue, green and red light each emitted from each of the elements is higher than the light emitted from each of the elements having the color converter under the transparent electrode, respectively.

Example 8

An example of the displaying device constituted by the organic El element prepared in Example 5 is described below according to the drawing.

Figure 3:
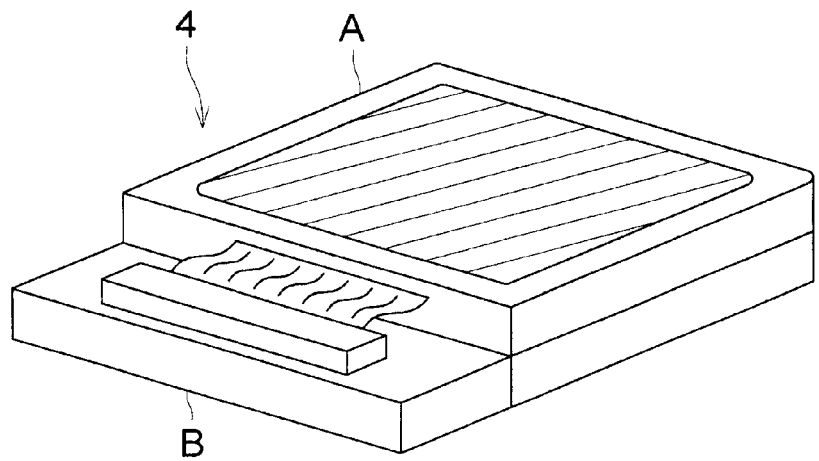
FIG. 3 is a schematic drawing showing an example of displaying apparatus constituting an organic EL element.

FIG. 3 is a schematic drawing of a displaying device such as a display of portable telephone, which displays image information by light emission of the organic EL element.

Display 4 comprises a displaying device A having plural pixels 6 and a controlling device B performing the image scanning the displaying device A according to the image information.

Controlling device B electrically connected with displaying device A sends scanning signals and image signals to the plural pixels 6 according to the external image information. The pixels 6 on each of the scanning lines emit light in sequence according to the scanning signals to scan the image. Thus the image information is displayed on the displaying device A.

FIG. 4 is a schematic drawing of the displaying device A.

Displaying device A has a wiring portion including a scanning line 8 and a data line 9 and a plurality of pixel 6 on a substrate. Significant parts of displaying device A are described below.

The drawing shows a case that the light emitted from the pixel 6 is put out in the direction of the white arrow (to the lower direction).

The scanning lines 8 and the plural data lines 9 are each composed of an electro conductive material in the wiring portion and the scanning lines 8 and the data lines 9 are crossed at right angle in a form of lattice and connected to the pixel 6 at the crossing position (the detail is not shown in the drawing).

When the scanning signal is applied through the scanning line 8 to the pixel 6, the pixel 6 receives an image signal through the image line 9 and emits light according to the received image signal. A full color image can be displayed by suitably arranging the pixel emitting red light, that emitting green light and that emitting blue light on one substrate.

Figure 5:
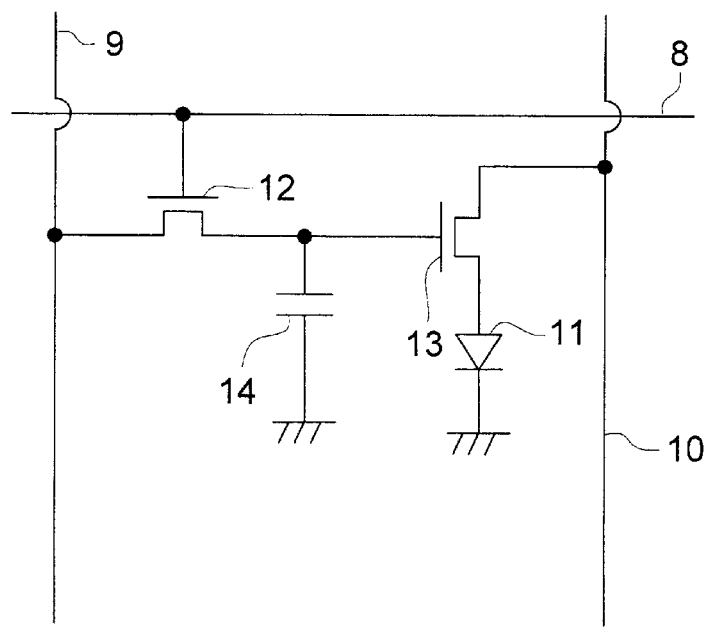
FIG. 5 is a schematic drawing of a pixel.

The light emitting process of the pixel 6 is described below. FIG. 5 is a schematic drawing of the pixel 6.

The pixel 6 has an organic EL element 11, a switching transistor 12, a driving transistor 13 and a condenser 14.

In the drawing, the image signal is applied from the controlling device B to the drain of the switching transistor 12 through the data line 9. Then driving of the switching transistor 12 is turned on when the scanning signal is applied from the controlling device to the gate of the transistor 12 through the scanning line 8 and the image signal applied to the drain is transmitted to the condenser 14 and the gate of the driving transistor 13.

The condenser 14 is charged corresponding to the potential of the image signal and the transistor 13 was driven when the image data signal is transmitted. The drain of the driving transistor 14 is connected to a power source line 10 and the source of the transistor is connected to the electrode of the organic EL element 11, and a current corresponding to the potential of the image signal applied to the gate is supplied through the power source line to the organic EL element 11.

When the scanning signal is moved to the next scanning line 8 by the sequential scanning by the controlling device B, driving of the switching transistor 12 is turned off. However, driving of the driving transistor 13 is continued since the condenser 14 holds the charged potential of the image signal, and the light emission of the organic EL element 11 is continued until the next scanning signal is applied. When the next scanning signal is applied by the sequential scanning, the driving transistor 13 is driven corresponding to the potential of the next image signal synchronized with the scanning signal so that the organic EL element 11 emits light.

Namely, the light emission of the organic EL element 11 of each of the pixels 6 is performed by the switching transistor 12 and the driving transistor 13 provided to each of the pixels 6, such the system is called an active matrix system.

The light emission by the organic EL element may either be light emission having plural gradation corresponding to multi-value image date signal having plural gradation potential or on-off light emission with a prescribed light amount according to a binary image data signal. The potential of the condenser 14 may be either held until the application of the next scanning signal or discharged just before the application of the next scanning signal.

In the invention, a passive matrix light emission driving system in which the organic EL element emits light only at the time of the scanning signal is applied may also be applicable, not only the active matrix system.

Figure 6:
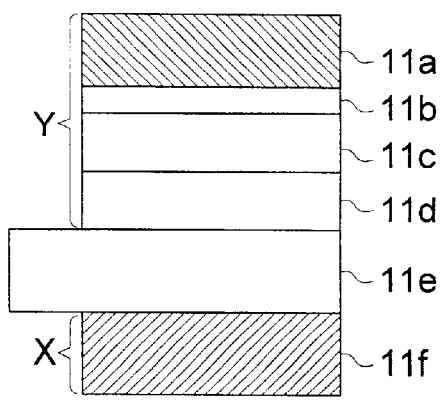
FIG. 6 is a cross-section of an organic EL element viewing from the thicker direction.
Figure 6:
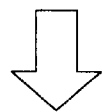
Figure 6:
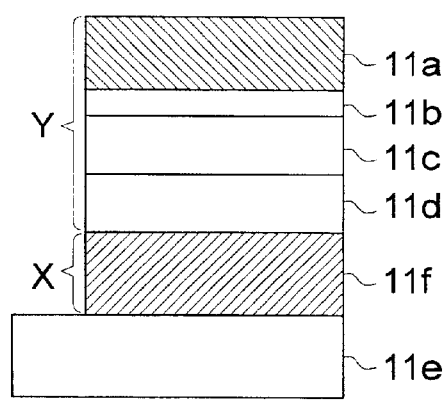
Figure 6:
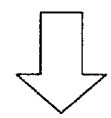

FIG. 6 is a cross-section viewed from the thick direction of the part of the organic EL element of the pixel 6. FIGS. 6a and 6b each show embodiments different from each other in the arrangement of the color converter. In the embodiment shown in FIG. 6a, the organic EL part Y and the color conversion part X are each arranged upper and lower side of the transparent substrate 11e, respectively. In the embodiment of he organic EL element 11 shown in FIG. 6b, the color conversion part X and the organic EL part Y are layered in this order on the upper side of the transparent substrate.

In the drawings, 11a is a metal electrode, 11b is the cathode buffer layer, 11c is the organic compound thin layer including the light emission layer, 11d is the transparent electrode, lie is the transparent substrate and 11f is the color conversion layer.

The light emission layer emits light depending on the amount of an electric current when the electric current is applied to the cathode buffer layer 11b and the organic compound thin layer 11c through the metal electrode 11a and the transparent electrode 11d. The emitted light is taken out in the lower direction of the drawing. The light is absorbed by the color conversion layer 11f through the transparent substrate 11e. Light of the red region, green region or blue light can be out put in the direction of the white arrow in the drawing when the color conversion layer has a red, green or blue light conversion function, respectively.

Figure 7:
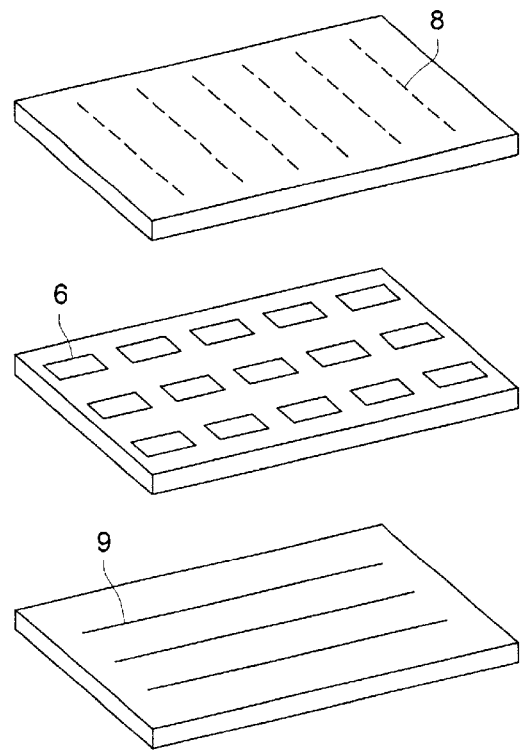
FIG. 7 is a schematic drawing of a displaying apparatus by a passive matrix system.

FIG. 7 is a schematic drawing of display device A according to the passive matrix system.

As is shown in FIG. 7, plural scanning lines 8 and plural image data lines 9 are lattice-wise arranged so as to be faced to each other across the pixel 6.

The pixel 6 connected with the scanning line 8 emits light corresponding to the applied signal when the scanning signal is applied to the scanning line by the sequential scanning. The production cost can be reduced in the passive matrix system since such the system has no active element in the pixel 6.

Example 7

On one side of a poly(ethersulfon) (PES) film having a size of 25 mm×75 mm and a thickness of 0.1 mm, Sumilite FS-1300 manufactured by Sumitomo Bakelite Co., Ltd., a moisture resistive inorganic oxide substance layer having a thickness of 600 angstrom and composed of silicon oxide $SiO_x$ was formed by a reactive spattering method using Si as a spattering gate. The reactive spattering was performed by the following procedure; the PES film was set in a spattering apparatus and the pressure in the vacuum tank was reduced by $1 \times 10^{-3}$ Pa or less, then Ar gas and $O_2$ gas each having a purity of 99.99% were injected to the vacuum tank so that the pressure was become by $1.0 \times 10^{-1}$ Ps and spattering was carried out by an applying voltage to the target of 400V and a substrate temperature of 80° C.

On the moisture resistive inorganic oxide layer, a moisture resistive inorganic oxo-nitride layer having a thickness of 200 angstrom and composed of silicon oxo-nitride $SiO_{1.5}N_{0.6}$ was formed by spattering using $Si_3N_4$ as the spattering target in the atmosphere of a mixture of Ar gas and $O_2$ gas each having a purity of 99.99%.

Moreover, on the moisture resistive inorganic oxo-nitride layer, an amorphous oxide layer having a thickness of 250 nm and containing elemental indium and elemental zinc as the significant cationic element was formed by a DC magnetron spattering method using a sintered mixture of indium oxide and zinc oxide in a atomic ratio In/(In+Zn) of 0.80 as the spattering target. The DC magnetron spattering was performed by the following procedure; the PES film was set in a DC magnetron spattering apparatus, and the pressure in the vacuum tank was reduced by $1\times10^{-3}$ Pa or less, then Ar gas and $O_2$ gas each having a purity of 99.99% were injected to the vacuum tank so that the pressure was become by $1.0\times10^{-1}$ Ps and spattering was carried out by applying a voltage of 420V to the target and a substrate temperature of 60° C. The transparent electro conductive layer was subjected to patterning and ultrasonic washing in i-propyl alcohol, drying by dried nitrogen gas and cleaning by UV-ozone for 5 minutes.

On the PES film carrying the transparent electro conductive layer, m-MTDATA was evaporated to form a positive hole charge transportation layer having a thickness of 30 nm in the same manner as in Example 4. Compound 7 was evaporated on the positive hole charge transportation layer to form a light emission layer having a thickness of 40 nm. BC was further evaporated on the light emission layer to form an electron transportation layer having a thickness of 30 nm. Moreover, Lithium fluoride was evaporated so as to form a 0.5 nm cathode buffer layer and aluminum was evaporated to form a counter electrode having a thickness of 100 nm. Thus Organic EL element OLED-201 according to the invention was prepared. Besides, Organic EL element OLED-202 according to the invention was prepared in the same manner as in OLED-201 except that m-MTDATA was replaced by Compound 57. Both of the elements were each emits bluish purple light when direct current of 10 V was applied between the transparent electrode as the anode and the aluminum counter electrode as the cathode at 23° C. in a dried nitrogen gas atmosphere.

Figure 8:
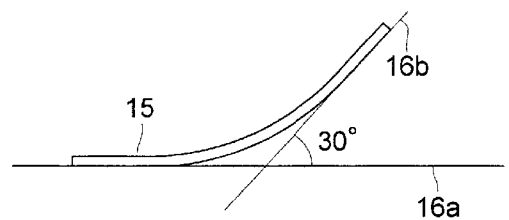
FIG. 8 is a schematic drawing of a bended organic EL element viewing from the longer side direction.

FIG. 8 shows a schematic drawing of a bended organic EL element viewing from the longer side. OLED-201 and OLED-202 were each bended by applying force to the shorter side thereof as shown in FIG. 8. The film substrate of each of the elements was not broken and the elements emit light in the bended state.

As is shown in the above-mentioned, a flexible organic EL element having can be provided.

Example 8

Figure 9:
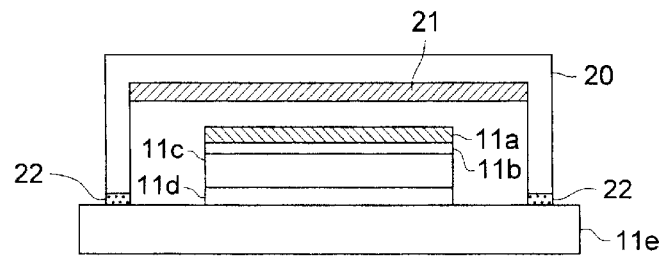
FIG. 9 is a cross-section of a sealed organic EL element viewing from the thicker direction.

A concave glass sealing can was used as a sealing member 20, and barium oxide was pasted to the bottom of the can as the desiccant 21. In a dry box under a nitrogen gas stream, a light hardenable adhesive agent, Laxtruc LCR0629B manufactured by Toa Gosei Co., Ltd., was coated as the sealing agent 22 to the convex portion of the around of the sealing member, and the sealing member is set so as to cover the displaying part of organic EL element OLED-105 of Example 4. Then the convex portion of the sealing member, the surface of the transparent substrate lie and the surface of the lead electrodes of the cathode and anode were adhered by lighting. Thus organic EL element OLED-301 shown in FIG. 9 was prepared. OLED-301 emits light in the lower direction in the drawing.

The light emission portion of OLED-301 was photographed in a magnitude of 50 times. Then the organic EL element was stored at 85° C. for 500 hours. Thereafter, the light emission portion was photographed in the same manner as in that just after the sealing. Formation of dark spot was not observed by comparing these enlarged photographs.

As a result of that, an organic EL element capable of maintaining the stable light emission in the atmosphere can be provided.

As a result of the invention, an organic EL element can be obtained which is excellent in the brightness of emitting light and the life and emits light within the range of from blue to bluish purple.

As is proved by the examples, the organic electro-luminescent element and the material of organic electro-luminescent element according to the invention can emit light of from blue to bluish purple with high brightness and a long life.

As a result of that, an organic EL element capable of maintaining the stable light emission in the atmosphere can be provided.

The other preferable embodiments of the invention are described.

An electro-luminescent element comprising one or more organic compound layers, at least one of which is a light emitting layer, provided between two electrodes facing to each other wherein at least one of the organic compound layers contains a compound represented by the following Formula I:

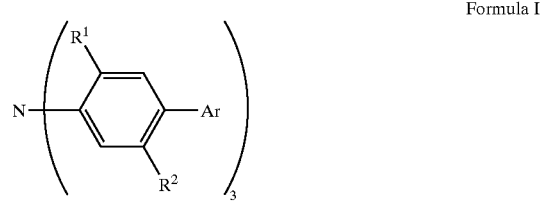

Formula I wherein $R^1$ and $R^2$ are each a substituent, and Ar is an aromatic hydrocarbon ring or an aromatic heterocyclic ring each of them may have a substituent.

The organic electro-luminescent element of Item 1, wherein Ar in Formula I is a group represented by the following Formula II:

Formula II wherein one or more R³s are each a substituent and n1 is an integer of from 0 to 7.

In the organic electro-luminescent element described above, Ar in Formula I is preferably a group represented by the following Formula III:

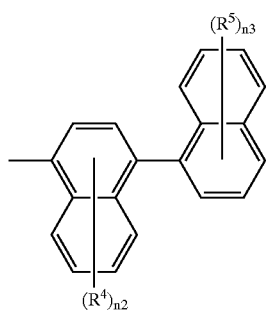

Formula III wherein one or more $R^4$ and $R^5$ are each a substituent, n2 is an integer of from 0 to 6, and n3 is an integer of from 0 to 7.

An electro-luminescent element comprising one or more organic compound layers, at least one of which is a light emitting layer, provided between two electrodes facing to each other wherein at least one of the organic compound layers contains a compound represented by the following Formula IV:

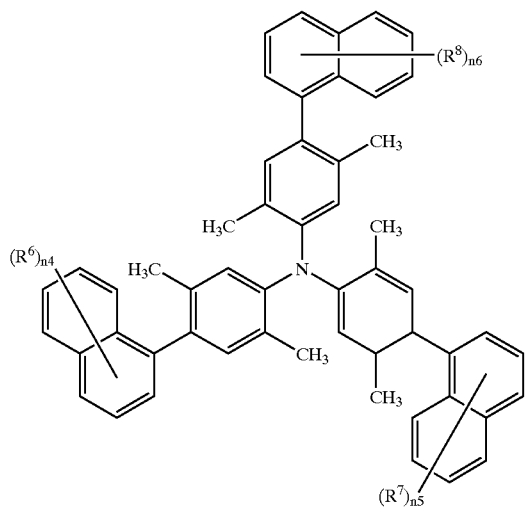

Formula IV wherein one more $R^6$, $R^7$ and $R^8$ are each an alkyl group, a cycloalkyl group, an aryl group, a halogen atom, an alkoxy group, an aryloxy group or a heterocyclic group; and n4, n5 and n6 are each an integer of from 0 to 7.

A material of electro-luminescent element represented by the Formula IV:

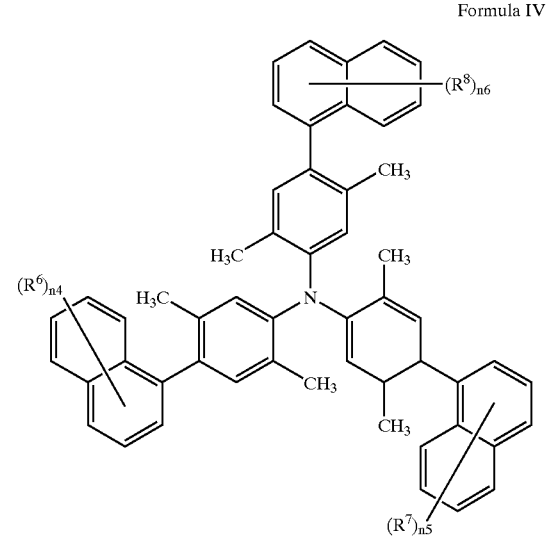

Formula IV wherein one more $R^6$, $R^7$ and $R^8$ are each an alkyl group, a cycloalkyl group, an aryl group, a halogen atom an alkoxy group, an aryloxy group or a heterocyclic group; and n4, n5 and n6 are each an integer of from 0 to 7.

An electro-luminescent element comprising one or more organic compound layers, at least one of which is a light emitting layer, provided between two electrodes facing to each other wherein at least one of the organic compound layers contains a compound represented by the Formula V:

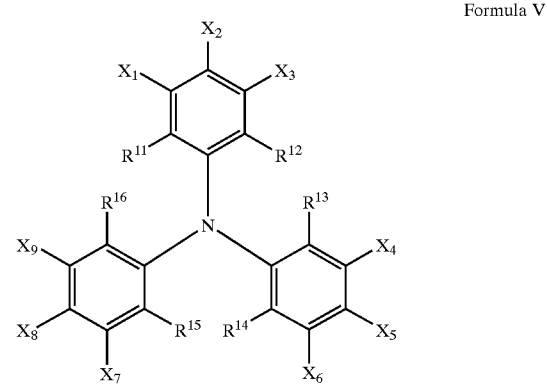

Formula V wherein $R^{11}$ through $R^{16}$ and $X_1$ through $X_9$ are each a hydrogen atom or a substituent, they may be the same or different; and the sum of the steric parameters $Es_{R1}$ through $Es_{R16}$ of $R^{11}$ through $R^{16}$ satisfies the following expression:

$$Es_{R11}+Es_{R12}+Es_{R13}+Es_{R14}+Es_{R15}+Es_{R16} \leq -2.0.$$

A material of electro-luminescent element represented by the following Formula V:

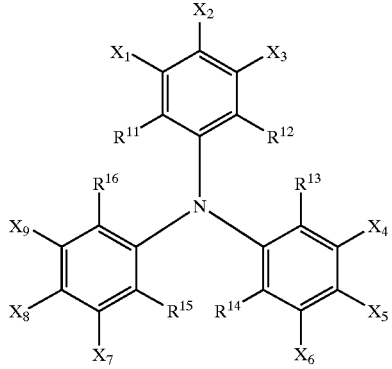

Formula V wherein $R^{11}$ through $R^{16}$ and $X_1$ through $X_9$ are each a hydrogen atom or a substituent, they may be the same or different; and the sum of the steric parameters $Es_{R1}$ through $Es_{R16}$ of $R^{11}$ through $R^{16}$ satisfies the following expression:

$$Es_{R11}+Es_{R12}+Es_{R13}+Es_{R14}+Es_{R15}+Es_{R16} \leq -2.0.$$

An electro-luminescent element comprising one or more organic compound layers, at least one of which is a light emitting layer, provided between two electrodes facing to each other wherein at least one of the organic compound layers contains a compound represented by the following Formula V and at last one cathode buffer layers is provided between the organic compound layer and the cathode:

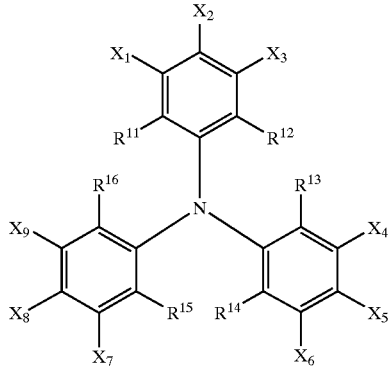

Formula V wherein $R^{11}$ through $R^{16}$ and $X_1$ through $X_9$ are each a hydrogen atom or a substituent, they may be the same or different; and the sum of the steric parameters $Es_{R1}$ through $Es_{R16}$ of $R^{11}$ through $R^{16}$ satisfies the following expression:

$$Es_{R11}+Es_{R12}+Es_{R13}+Es_{R14}+Es_{R15}+Es_{R16} \leq -2.0.$$

An electro-luminescent element comprising one or more organic compound layers, at least one of which is a light emitting layer, provided between two electrodes facing to each other, wherein at least one of the organic compound layers contains a compound represented by the following Formula VI:

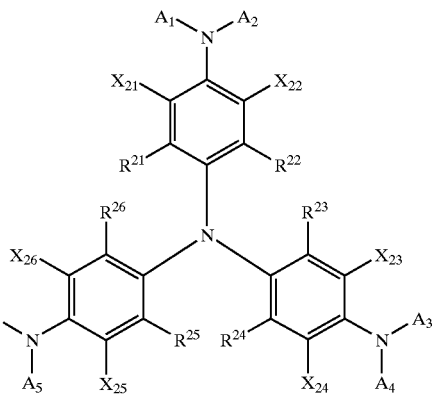

Formula VI wherein $R^{21}$ through $R^{26}$, $X_1$, $X_3$, $X_4$, $X_6$, $X_7$, and $X_9$ and $A_1$ through $A_6$ are each a hydrogen atom or a substituent, they may be the same or different; and the sum of the steric parameters $Es_{R21}$ through $Es_{R26}$ of $R^{21}$ through $R^{26}$ satisfies the following expression:

$$Es_{R21}+Es_{R22}+Es_{R23}+Es_{R24}+Es_{R25}+Es_{R26} \leq -2.0.$$

An electro-luminescent element comprising one or more organic compound layers, at least one of which is a light emitting layer, provided between two electrodes facing to each other, wherein at least one of the organic compound layers contains a compound represented by the following Formula VI; and at last one cathode buffer layers is provided between the organic compound layer and the cathode:

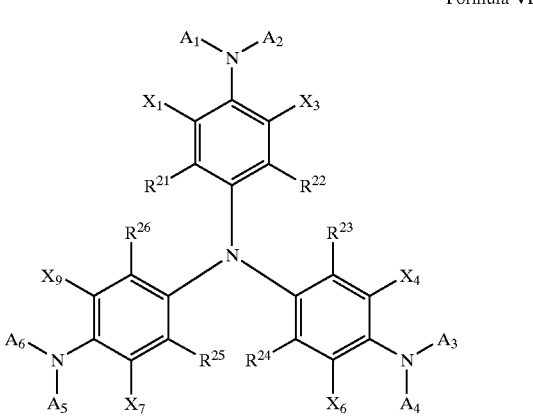

Formula VI wherein $R^{21}$ through $R^{26}$, $X_1$, $X_3$, $X_4$, $X_6$, $X_7$, and $X_9$ and $A_1$ through $A_6$ are each a hydrogen atom or a substituent, they may be the same or different; and the sum of the steric parameters $Es_{R21}$ through $Es_{R26}$ of $R^{21}$ through $R^{26}$ satisfies the following expression:

$$Es_{R21}+Es_{R22}+Es_{R23}+Es_{R24}+Es_{R25}+Es_{R26} \leq -2.0$$

A material of electro-luminescent element represented by the following Formula VI:

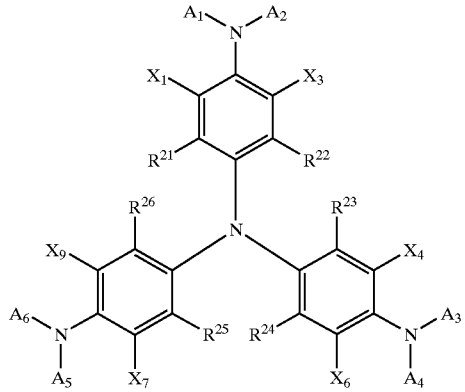

Formula VI wherein $R^{21}$ through $R^{26}$, $X_1$, $X_3$, $X_4$, $X_6$, $X_7$, and $X_9$ and $A_1$ through $A_6$ are each a hydrogen atom or a substituent, they may be the same or different; and the sum of the steric parameters $Es_{R21}$ through $Es_{R26}$ of $R^{21}$ through $R^{26}$ satisfies the following expression:

$$Es_{R21}+Es_{R22}+Es_{R23}+Es_{R24}+Es_{R25}+Es_{R26} \leq -2.0.$$

What is claimed is:

1. An electro-luminescent element comprising an organic compound layer between a cathode and an anode, wherein the organic compound is represented by

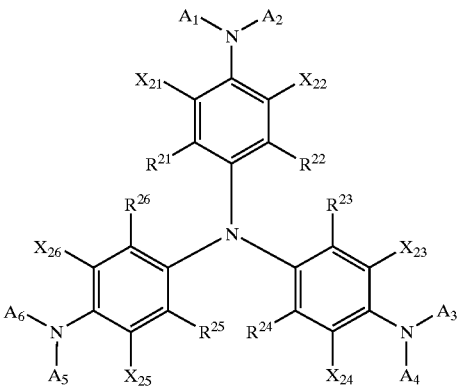

Formula VI wherein $R^{21}$ through $R^{26}$, $X_{21}$ through $X_{26}$ and $A_1$ through $A_6$ are each a hydrogen atom or a substituent, they may be the same or different; and the sum of the steric parameters $Es_{R21}$ through $Es_{R26}$ of $R_{21}$ through $R^{26}$ satisfies the following expression:

$$Es_{R21}+Es_{R22}+Es_{R23}+Es_{R24}+Es_{R25}+Es_{R26} \leq -2.0.$$

2. A display apparatus comprising a plural number of organic electro-luminescent element of claim 1 on a support.

* * * * *